US008828328B1

(12) United States Patent
Leamon et al.

(10) Patent No.: US 8,828,328 B1
(45) Date of Patent: Sep. 9, 2014

(54) METHODS AND APPARATUSES FOR NANO-MATERIALS POWDER TREATMENT AND PRESERVATION

(75) Inventors: David Leamon, Gilbert, AZ (US); Frederick P. Layman, Carefree, AZ (US); Eliseo Ruiz, Queen Creek, AZ (US); Maximilian A. Biberger, Scottsdale, AZ (US)

(73) Assignee: SDCmaterails, Inc., Tempe, AZ (US)

( * ) Notice: Subject to any disclaimer, the term of this patent is extended or adjusted under 35 U.S.C. 154(b) by 539 days.

(21) Appl. No.: 12/969,503

(22) Filed: Dec. 15, 2010

Related U.S. Application Data

(60) Provisional application No. 61/284,329, filed on Dec. 15, 2009.

(51) Int. Cl.
 *A61L 2/00* (2006.01)
(52) U.S. Cl.
 USPC .......................................... 422/300; 977/900
(58) Field of Classification Search
 CPC ............ Y10S 977/775; Y10S 977/773; C01P 2004/64
 USPC .......................................... 422/300; 977/900
 See application file for complete search history.

(56) References Cited

U.S. PATENT DOCUMENTS

| | | | |
|---|---|---|---|
| 2,284,554 A | 5/1942 | Beyerstedt | |
| 2,419,042 A | 4/1947 | Todd | 202/205 |
| 2,519,531 A | 8/1950 | Worn | 230/95 |
| 2,562,753 A | 7/1951 | Trost | 241/39 |
| 2,689,780 A | 9/1954 | Rice | 23/106 |
| 3,001,402 A | 9/1961 | Koblin | 73/421.5 |
| 3,042,511 A | 7/1962 | Reding, Jr. | |
| 3,067,025 A | 12/1962 | Chisholm | 75/84.5 |
| 3,145,287 A | 8/1964 | Siebein et al. | |
| 3,178,121 A | 4/1965 | Wallace, Jr. | 241/5 |
| 3,179,782 A | 4/1965 | Matvay | |
| 3,181,947 A | 5/1965 | Vordahl | |
| 3,313,908 A | 4/1967 | Unger et al. | |
| 3,401,465 A | 9/1968 | Larwill | 34/57 |
| 3,450,926 A | 6/1969 | Kiernan | |

(Continued)

FOREIGN PATENT DOCUMENTS

| | | |
|---|---|---|
| EP | 1 134 302 A1 | 9/2001 |
| EP | 1 619 168 A1 | 1/2006 |

(Continued)

OTHER PUBLICATIONS

21 C.F. R. § 113, Thermally Processed Lowacid Foods Packaged in Hermetically Sealed Containers.*

(Continued)

*Primary Examiner* — Kevin Joyner
(74) *Attorney, Agent, or Firm* — Morrison & Foerster LLP

(57) ABSTRACT

Apparatuses for and methods of nano-material powder preservation and dispersion in liquid, capture, and treatments are disclosed. The applications of the present disclosure ensure powder accountability of the nano-materials preventing the nano material from dispersing into the air. The method of treating a nano-material comprises receiving a nano-material and mixing/dispersing the nano-material with a fluid in a vessel until the nano-material is sealed by the fluid. The apparatus for treating a nano-material comprises a hermetically sealable vessel containing a nano-material and a fluid, wherein the fluid is configured to increase the isolation between particles of the nano-material.

16 Claims, 11 Drawing Sheets

(56) References Cited

U.S. PATENT DOCUMENTS

Figure 1:
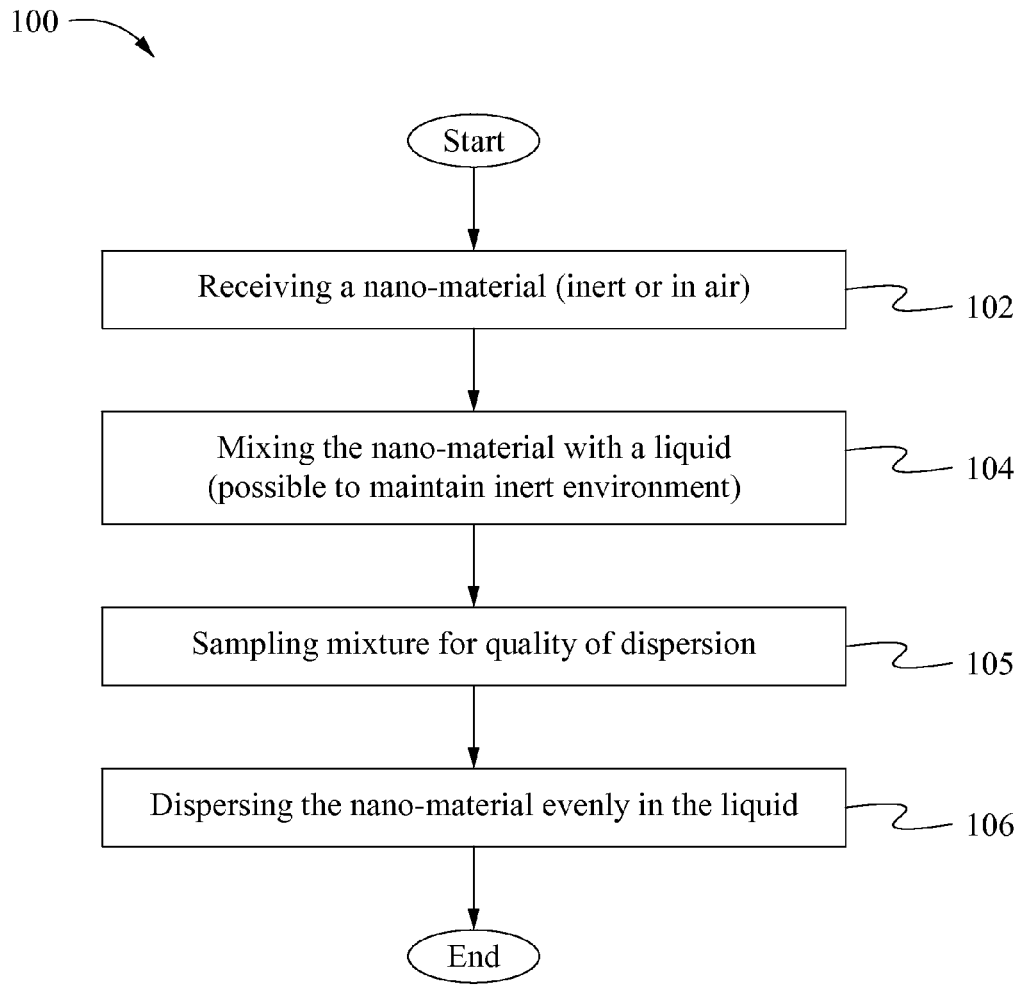

| | | | |
|---|---|---|---|
| 3,457,788 A | 7/1969 | Miyajima | 73/422 |
| 3,537,513 A | 11/1970 | Austin | 165/70 |
| 3,552,653 A | 1/1971 | Inoue | |
| 3,617,358 A | 11/1971 | Dittrich | |
| 3,667,111 A | 6/1972 | Chartet | |
| 3,741,001 A | 6/1973 | Fletcher et al. | 73/28 |
| 3,752,172 A | 8/1973 | Cohen et al. | 137/12 |
| 3,761,360 A | 9/1973 | Auvil et al. | |
| 3,774,442 A | 11/1973 | Gustavsson | 73/28 |
| 3,804,034 A | 4/1974 | Stiglich, Jr. | |
| 3,830,756 A | 8/1974 | Sanchez et al. | |
| 3,871,448 A | 3/1975 | Vann et al. | |
| 3,892,882 A | 7/1975 | Guest et al. | 427/34 |
| 3,914,573 A | 10/1975 | Muehlberger | 219/76 |
| 3,959,094 A | 5/1976 | Steinberg | |
| 3,959,420 A | 5/1976 | Geddes et al. | 261/112 |
| 3,969,482 A | 7/1976 | Teller | |
| 4,008,620 A | 2/1977 | Narato et al. | 73/421.5 A |
| 4,018,388 A | 4/1977 | Andrews | 241/39 |
| 4,021,021 A | 5/1977 | Hall et al. | |
| 4,127,760 A | 11/1978 | Meyer et al. | |
| 4,139,497 A | 2/1979 | Castor et al. | 252/470 |
| 4,157,316 A | 6/1979 | Thompson et al. | |
| 4,171,288 A | 10/1979 | Keith et al. | 252/462 |
| 4,174,298 A | 11/1979 | Antos | |
| 4,189,925 A | 2/1980 | Long | |
| 4,227,928 A | 10/1980 | Wang | |
| 4,248,387 A | 2/1981 | Andrews | 241/5 |
| 4,253,917 A | 3/1981 | Wang | |
| 4,260,649 A | 4/1981 | Dension et al. | |
| 4,284,609 A | 8/1981 | deVries | 423/242 |
| 4,315,874 A * | 2/1982 | Ushida et al. | 264/5 |
| 4,344,779 A | 8/1982 | Isserlis | |
| 4,369,167 A | 1/1983 | Weir | |
| 4,388,274 A | 6/1983 | Rourke et al. | 422/177 |
| 4,419,331 A | 12/1983 | Montalvo | |
| 4,431,750 A | 2/1984 | McGinnis et al. | |
| 4,436,075 A | 3/1984 | Campbell et al. | 123/557 |
| 4,440,733 A | 4/1984 | Lawson et al. | |
| 4,458,138 A | 7/1984 | Adrian et al. | |
| 4,459,327 A | 7/1984 | Wang | |
| 4,505,945 A | 3/1985 | Dubust et al. | |
| 4,513,149 A | 4/1985 | Gray et al. | 564/449 |
| 4,523,981 A | 6/1985 | Ang et al. | |
| 4,545,872 A | 10/1985 | Sammells et al. | |
| RE32,244 E | 9/1986 | Andersen | |
| 4,609,441 A | 9/1986 | Frese, Jr. et al. | |
| 4,723,589 A | 2/1988 | Iyer et al. | |
| 4,731,517 A | 3/1988 | Cheney | |
| 4,751,021 A | 6/1988 | Mollon et al. | |
| 4,764,283 A | 8/1988 | Ashbrook et al. | 210/695 |
| 4,765,805 A | 8/1988 | Wahl et al. | |
| 4,824,624 A | 4/1989 | Palicka et al. | 264/67 |
| 4,836,084 A | 6/1989 | Vogelesang et al. | |
| 4,855,505 A | 8/1989 | Koll | 564/398 |
| 4,866,240 A | 9/1989 | Webber | 219/121.47 |
| 4,885,038 A | 12/1989 | Anderson et al. | |
| 4,921,586 A | 5/1990 | Molter | |
| 4,983,555 A | 1/1991 | Roy et al. | 501/120 |
| 4,987,033 A | 1/1991 | Abkowitz et al. | 428/469 |
| 5,006,163 A | 4/1991 | Benn et al. | |
| 5,015,863 A | 5/1991 | Takeshima et al. | |
| 5,041,713 A | 8/1991 | Weidman | 219/121.51 |
| 5,043,548 A | 8/1991 | Whitney et al. | 219/121.84 |
| 5,070,064 A | 12/1991 | Hsu et al. | |
| 5,073,193 A | 12/1991 | Chaklader et al. | 75/346 |
| 5,133,190 A | 7/1992 | Abdelmalek | |
| 5,151,296 A | 9/1992 | Tokunaga | |
| 5,157,007 A | 10/1992 | Domesle et al. | |
| 5,192,130 A | 3/1993 | Endo et al. | |
| 5,230,844 A | 7/1993 | Macaire et al. | |
| 5,233,153 A | 8/1993 | Coats | |
| 5,269,848 A | 12/1993 | Nakagawa | |
| 5,330,945 A | 7/1994 | Beckmeyer et al. | |
| 5,338,716 A | 8/1994 | Triplett et al. | |
| 5,369,241 A | 11/1994 | Taylor et al. | 219/121.47 |
| 5,371,049 A | 12/1994 | Moffett et al. | 501/89 |
| 5,372,629 A | 12/1994 | Anderson et al. | 75/332 |
| 5,392,797 A | 2/1995 | Welch | 134/108 |
| 5,436,080 A | 7/1995 | Inoue et al. | |
| 5,439,865 A | 8/1995 | Abe et al. | 502/333 |
| 5,442,153 A | 8/1995 | Marantz et al. | 219/121.47 |
| 5,460,701 A | 10/1995 | Parker et al. | |
| 5,464,458 A | 11/1995 | Yamamoto | |
| 5,485,941 A | 1/1996 | Guyomard et al. | 222/1 |
| 5,534,149 A | 7/1996 | Birkenbeil et al. | 210/636 |
| 5,534,270 A * | 7/1996 | De Castro | 424/490 |
| 5,543,173 A | 8/1996 | Horn, Jr. et al. | |
| 5,553,507 A | 9/1996 | Basch et al. | 73/863.01 |
| 5,562,966 A | 10/1996 | Clarke et al. | |
| 5,611,896 A | 3/1997 | Swanepoel et al. | 204/169 |
| 5,630,322 A | 5/1997 | Heilmann et al. | 62/95 |
| 5,652,304 A | 7/1997 | Calderon et al. | |
| 5,714,644 A | 2/1998 | Irgang et al. | |
| 5,723,187 A | 3/1998 | Popoola et al. | |
| 5,726,414 A | 3/1998 | Kitahashi et al. | |
| 5,749,938 A | 5/1998 | Coombs | 75/332 |
| 5,776,359 A | 7/1998 | Schultz et al. | 252/62.51 |
| 5,788,738 A | 8/1998 | Pirzada et al. | 75/331 |
| 5,804,155 A | 9/1998 | Farrauto et al. | |
| 5,811,187 A | 9/1998 | Anderson et al. | 428/403 |
| 5,837,959 A | 11/1998 | Muehlberger et al. | 219/121.47 |
| 5,851,507 A | 12/1998 | Pirzada et al. | 423/659 |
| 5,853,815 A | 12/1998 | Muehlberger | 427/446 |
| 5,858,470 A | 1/1999 | Bernecki et al. | |
| 5,884,473 A | 3/1999 | Noda et al. | |
| 5,905,000 A | 5/1999 | Yadav et al. | 429/33 |
| 5,928,806 A | 7/1999 | Olah et al. | |
| 5,935,293 A | 8/1999 | Detering et al. | 75/10.29 |
| 5,973,289 A | 10/1999 | Read et al. | |
| 5,989,648 A | 11/1999 | Phillips | 427/456 |
| 5,993,967 A | 11/1999 | Brotzman, Jr. et al. | 428/407 |
| 5,993,988 A | 11/1999 | Ohara et al. | 429/40 |
| 6,004,620 A | 12/1999 | Camm | |
| 6,012,647 A | 1/2000 | Ruta et al. | 239/132.1 |
| 6,033,781 A | 3/2000 | Brotzman, Jr. et al. | 428/405 |
| 6,045,765 A | 4/2000 | Nakatsuji et al. | |
| 6,059,853 A | 5/2000 | Coombs | 75/332 |
| 6,066,587 A | 5/2000 | Kurokawa et al. | |
| 6,084,197 A | 7/2000 | Fusaro, Jr. | |
| 6,093,306 A | 7/2000 | Hanrahan et al. | |
| 6,093,378 A | 7/2000 | Deeba et al. | |
| 6,102,106 A | 8/2000 | Manning et al. | 165/76 |
| 6,117,376 A | 9/2000 | Merkel | |
| 6,168,694 B1 | 1/2001 | Huang et al. | |
| 6,190,627 B1 | 2/2001 | Hoke et al. | |
| 6,213,049 B1 | 4/2001 | Yang | 118/723 |
| 6,214,195 B1 | 4/2001 | Yadav et al. | 205/334 |
| 6,228,904 B1 | 5/2001 | Yadav et al. | 523/210 |
| 6,254,940 B1 | 7/2001 | Pratsinis et al. | 427/562 |
| 6,261,484 B1 | 7/2001 | Phillips et al. | 264/5 |
| 6,267,864 B1 | 7/2001 | Yadav et al. | 205/341 |
| 6,322,756 B1 | 11/2001 | Arno et al. | |
| 6,342,465 B1 | 1/2002 | Klein et al. | |
| 6,344,271 B1 | 2/2002 | Yadav et al. | 428/402 |
| 6,362,449 B1 | 3/2002 | Hadidi et al. | |
| 6,379,419 B1 | 4/2002 | Celik et al. | 75/346 |
| 6,387,560 B1 | 5/2002 | Yadav et al. | 429/45 |
| 6,395,214 B1 | 5/2002 | Kear et al. | 264/434 |
| 6,398,843 B1 | 6/2002 | Tarrant | 75/249 |
| 6,409,851 B1 | 6/2002 | Sethuram et al. | 148/565 |
| 6,413,781 B1 | 7/2002 | Geis et al. | 436/178 |
| 6,416,818 B1 | 7/2002 | Aikens et al. | 427/383.1 |
| RE37,853 E | 9/2002 | Detering et al. | 75/10.19 |
| 6,444,009 B1 | 9/2002 | Liu et al. | 75/332 |
| 6,475,951 B1 | 11/2002 | Domesle et al. | |
| 6,488,904 B1 | 12/2002 | Cox et al. | |
| 6,506,995 B1 | 1/2003 | Fusaro, Jr. et al. | |
| 6,517,800 B1 | 2/2003 | Cheng et al. | 423/447.1 |
| 6,524,662 B2 | 2/2003 | Jang et al. | 427/535 |
| 6,531,704 B2 | 3/2003 | Yadav et al. | 250/493.1 |
| 6,548,445 B1 | 4/2003 | Buysch et al. | |
| 6,554,609 B2 | 4/2003 | Yadav et al. | 432/9 |
| 6,562,304 B1 | 5/2003 | Mizrahi | |

(56) References Cited

U.S. PATENT DOCUMENTS

| | | | |
|---|---|---|---|
| 6,562,495 B2 | 5/2003 | Yadav et al. | 429/12 |
| 6,569,393 B1 | 5/2003 | Hoke et al. | |
| 6,569,397 B1 | 5/2003 | Yadav et al. | 423/345 |
| 6,569,518 B2 | 5/2003 | Yadav et al. | 428/323 |
| 6,572,672 B2 | 6/2003 | Yadav et al. | 75/343 |
| 6,579,446 B1 | 6/2003 | Teran et al. | |
| 6,596,187 B2 | 7/2003 | Coll et al. | 216/56 |
| 6,603,038 B1 | 8/2003 | Hagemeyer et al. | 560/241.1 |
| 6,607,821 B2 | 8/2003 | Yadav et al. | 428/323 |
| 6,610,355 B2 | 8/2003 | Yadav et al. | |
| 6,623,559 B2 | 9/2003 | Huang | 117/87 |
| 6,635,357 B2 | 10/2003 | Moxson et al. | 428/548 |
| 6,641,775 B2 | 11/2003 | Vigliotti et al. | 264/618 |
| 6,652,822 B2 | 11/2003 | Phillips et al. | 423/290 |
| 6,652,967 B2 | 11/2003 | Yadav et al. | 428/403 |
| 6,669,823 B1 | 12/2003 | Sarkas et al. | 204/164 |
| 6,682,002 B2 | 1/2004 | Kyotani | 239/318 |
| 6,689,192 B1 | 2/2004 | Phillips et al. | 75/342 |
| 6,699,398 B1 | 3/2004 | Kim | 216/55 |
| 6,706,097 B2 | 3/2004 | Zornes | 96/153 |
| 6,706,660 B2 | 3/2004 | Park | |
| 6,710,207 B2 | 3/2004 | Bogan, Jr. et al. | |
| 6,713,176 B2 | 3/2004 | Yadav et al. | 428/402 |
| 6,716,525 B1 | 4/2004 | Yadav et al. | 428/402 |
| 6,744,006 B2 | 6/2004 | Johnson et al. | |
| 6,746,791 B2 | 6/2004 | Yadav et al. | 429/30 |
| 6,772,584 B2 | 8/2004 | Chun et al. | 60/275 |
| 6,786,950 B2 | 9/2004 | Yadav et al. | 75/346 |
| 6,813,931 B2 | 11/2004 | Yadav et al. | 73/31.05 |
| 6,817,388 B2 | 11/2004 | Tsangaris et al. | 141/82 |
| 6,832,735 B2 | 12/2004 | Yadav et al. | 241/16 |
| 6,838,072 B1 | 1/2005 | Kong et al. | 423/594.2 |
| 6,841,509 B1 | 1/2005 | Hwang et al. | |
| 6,855,410 B2 | 2/2005 | Buckley | |
| 6,855,426 B2 | 2/2005 | Yadav | 428/403 |
| 6,855,749 B1 | 2/2005 | Yadav et al. | 523/105 |
| 6,858,170 B2 | 2/2005 | Van Thillo et al. | |
| 6,886,545 B1 | 5/2005 | Holm | 123/568.21 |
| 6,896,958 B1 | 5/2005 | Cayton et al. | 428/323 |
| 6,902,699 B2 | 6/2005 | Fritzemeier et al. | 419/38 |
| 6,916,872 B2 | 7/2005 | Yadav et al. | 524/430 |
| 6,919,065 B2 | 7/2005 | Zhou et al. | |
| 6,919,527 B2 | 7/2005 | Boulos et al. | 219/121.52 |
| 6,933,331 B2 | 8/2005 | Yadav et al. | 523/210 |
| 6,972,115 B1 | 12/2005 | Ballard | |
| 6,986,877 B2 | 1/2006 | Takikawa et al. | 423/447.3 |
| 6,994,837 B2 | 2/2006 | Boulos et al. | |
| 7,007,872 B2 | 3/2006 | Yadav et al. | 241/1 |
| 7,022,305 B2 | 4/2006 | Drumm et al. | |
| 7,052,777 B2 | 5/2006 | Brotzman, Jr. et al. | 428/570 |
| 7,073,559 B2 | 7/2006 | O'Larey et al. | 164/76.1 |
| 7,081,267 B2 | 7/2006 | Yadav | 427/115 |
| 7,101,819 B2 | 9/2006 | Rosenflanz et al. | 501/10 |
| 7,147,544 B2 | 12/2006 | Rosenflanz | 451/28 |
| 7,147,894 B2 | 12/2006 | Zhou et al. | 427/256 |
| 7,166,198 B2 | 1/2007 | Van Der Walt et al. | 204/165 |
| 7,166,663 B2 | 1/2007 | Cayton et al. | 524/430 |
| 7,172,649 B2 | 2/2007 | Conrad et al. | 106/35 |
| 7,172,790 B2 | 2/2007 | Koulik et al. | |
| 7,178,747 B2 | 2/2007 | Yadav et al. | 241/23 |
| 7,208,126 B2 | 4/2007 | Musick et al. | 423/69 |
| 7,211,236 B2 | 5/2007 | Stark et al. | |
| 7,217,407 B2 | 5/2007 | Zhang | 423/610 |
| 7,220,398 B2 | 5/2007 | Sutorik et al. | 423/593.1 |
| 7,255,498 B2 | 8/2007 | Bush et al. | |
| 7,265,076 B2 | 9/2007 | Taguchi et al. | |
| 7,282,167 B2 | 10/2007 | Carpenter | |
| 7,307,195 B2 | 12/2007 | Polverejan et al. | 585/443 |
| 7,323,655 B2 | 1/2008 | Kim | 219/121.43 |
| 7,384,447 B2 | 6/2008 | Kodas et al. | 75/332 |
| 7,402,899 B1 * | 7/2008 | Whiting et al. | 257/678 |
| 7,417,008 B2 | 8/2008 | Richards et al. | |
| 7,494,527 B2 | 2/2009 | Jurewicz et al. | 75/346 |
| 7,517,826 B2 | 4/2009 | Fujdala et al. | |
| 7,534,738 B2 | 5/2009 | Fujdala et al. | |
| 7,541,012 B2 | 6/2009 | Yeung et al. | |
| 7,541,310 B2 | 6/2009 | Espinoza et al. | |
| 7,557,324 B2 | 7/2009 | Nylen et al. | |
| 7,572,315 B2 | 8/2009 | Boulos et al. | 75/336 |
| 7,576,029 B2 | 8/2009 | Saito et al. | |
| 7,576,031 B2 | 8/2009 | Beutel et al. | |
| 7,604,843 B1 | 10/2009 | Robinson et al. | |
| 7,611,686 B2 | 11/2009 | Alekseeva et al. | 423/276 |
| 7,615,097 B2 | 11/2009 | McKechnie et al. | 75/346 |
| 7,618,919 B2 | 11/2009 | Shimazu et al. | |
| 7,622,693 B2 | 11/2009 | Foret | 219/121.43 |
| 7,632,775 B2 | 12/2009 | Zhou et al. | |
| 7,635,218 B1 | 12/2009 | Lott | |
| 7,674,744 B2 | 3/2010 | Shiratori et al. | |
| 7,678,419 B2 | 3/2010 | Kevwitch et al. | |
| 7,704,369 B2 | 4/2010 | Olah et al. | |
| 7,709,411 B2 | 5/2010 | Zhou et al. | |
| 7,709,414 B2 | 5/2010 | Fujdala et al. | |
| 7,745,367 B2 | 6/2010 | Fujdala et al. | |
| 7,750,265 B2 | 7/2010 | Belashchenko et al. | |
| 7,803,210 B2 | 9/2010 | Sekine et al. | 75/334 |
| 7,851,405 B2 | 12/2010 | Wakamatsu et al. | |
| 7,874,239 B2 | 1/2011 | Howland | |
| 7,875,573 B2 | 1/2011 | Beutel et al. | |
| 7,897,127 B2 | 3/2011 | Layman et al. | |
| 7,902,104 B2 | 3/2011 | Kalck | |
| 7,905,942 B1 | 3/2011 | Layman | |
| 7,935,655 B2 | 5/2011 | Tolmachev | |
| 8,051,724 B1 | 11/2011 | Layman et al. | |
| 8,076,258 B1 | 12/2011 | Biberger | |
| 8,080,494 B2 | 12/2011 | Yasuda et al. | |
| 8,089,495 B2 | 1/2012 | Keller | |
| 8,142,619 B2 | 3/2012 | Layman et al. | |
| 8,168,561 B2 | 5/2012 | Virkar | |
| 8,173,572 B2 | 5/2012 | Feaviour | |
| 8,211,392 B2 | 7/2012 | Grubert et al. | |
| 8,258,070 B2 | 9/2012 | Fujdala et al. | |
| 8,278,240 B2 | 10/2012 | Tange et al. | |
| 8,294,060 B2 | 10/2012 | Mohanty et al. | |
| 8,309,489 B2 | 11/2012 | Cuenya et al. | |
| 8,349,761 B2 | 1/2013 | Xia et al. | |
| 8,557,727 B2 | 10/2013 | Yin et al. | |
| 2001/0004009 A1 | 6/2001 | MacKelvie | |
| 2001/0042802 A1 | 11/2001 | Youds | 241/5 |
| 2001/0055554 A1 | 12/2001 | Hoke et al. | |
| 2002/0018815 A1 | 2/2002 | Sievers et al. | 424/489 |
| 2002/0068026 A1 | 6/2002 | Murrell et al. | 422/211 |
| 2002/0071800 A1 | 6/2002 | Hoke et al. | |
| 2002/0079620 A1 | 6/2002 | DuBuis et al. | 264/328.14 |
| 2002/0100751 A1 | 8/2002 | Carr | |
| 2002/0102674 A1 | 8/2002 | Anderson | 435/174 |
| 2002/0131914 A1 | 9/2002 | Sung | |
| 2002/0143417 A1 | 10/2002 | Ito et al. | |
| 2002/0182735 A1 | 12/2002 | Kibby et al. | |
| 2002/0183191 A1 | 12/2002 | Faber et al. | |
| 2002/0192129 A1 | 12/2002 | Shamouilian et al. | |
| 2003/0036786 A1 | 2/2003 | Duren et al. | 607/96 |
| 2003/0042232 A1 | 3/2003 | Shimazu | 219/121.47 |
| 2003/0047617 A1 | 3/2003 | Shanmugham et al. | |
| 2003/0066800 A1 | 4/2003 | Saim et al. | 264/5 |
| 2003/0108459 A1 | 6/2003 | Wu et al. | 422/186.04 |
| 2003/0110931 A1 | 6/2003 | Aghajanian et al. | |
| 2003/0129098 A1 | 7/2003 | Endo et al. | |
| 2003/0139288 A1 | 7/2003 | Cai et al. | |
| 2003/0143153 A1 | 7/2003 | Boulos et al. | |
| 2003/0172772 A1 | 9/2003 | Sethuram et al. | 501/87 |
| 2003/0223546 A1 | 12/2003 | McGregor et al. | 378/143 |
| 2004/0009118 A1 | 1/2004 | Phillips et al. | 423/592.1 |
| 2004/0023302 A1 | 2/2004 | Archibald et al. | 435/7.1 |
| 2004/0023453 A1 | 2/2004 | Xu et al. | 257/369 |
| 2004/0077494 A1 | 4/2004 | LaBarge et al. | 502/303 |
| 2004/0103751 A1 | 6/2004 | Joseph et al. | 75/10.19 |
| 2004/0109523 A1 * | 6/2004 | Singh et al. | 376/272 |
| 2004/0119064 A1 | 6/2004 | Narayan et al. | |
| 2004/0127586 A1 | 7/2004 | Jin et al. | |
| 2004/0166036 A1 | 8/2004 | Chen et al. | |
| 2004/0167009 A1 | 8/2004 | Kuntz et al. | 501/95.2 |
| 2004/0176246 A1 | 9/2004 | Shirk et al. | 502/439 |
| 2004/0208805 A1 | 10/2004 | Fincke et al. | |

(56) References Cited

U.S. PATENT DOCUMENTS

| | | | |
|---|---|---|---|
| 2004/0213998 A1 | 10/2004 | Hearley et al. ............... 428/402 |
| 2004/0238345 A1 | 12/2004 | Koulik et al. |
| 2004/0251017 A1 | 12/2004 | Pillion et al. ................. 165/289 |
| 2004/0251241 A1 | 12/2004 | Blutke et al. |
| 2005/0000321 A1 | 1/2005 | O'Larey et al. ................ 75/952 |
| 2005/0000950 A1 | 1/2005 | Schroder et al. ......... 219/121.59 |
| 2005/0066805 A1 | 3/2005 | Park et al. |
| 2005/0070431 A1 | 3/2005 | Alvin et al. |
| 2005/0077034 A1 | 4/2005 | King ............................. 165/163 |
| 2005/0097988 A1 | 5/2005 | Kodas et al. .................... 75/332 |
| 2005/0106865 A1 | 5/2005 | Chung et al. |
| 2005/0133121 A1 | 6/2005 | Subramanian et al. |
| 2005/0163673 A1 | 7/2005 | Johnson et al. |
| 2005/0199739 A1 | 9/2005 | Kuroda et al. .................. 239/13 |
| 2005/0220695 A1 | 10/2005 | Abatzoglou et al. .......... 423/445 |
| 2005/0227864 A1 | 10/2005 | Sutorik et al. |
| 2005/0233380 A1 | 10/2005 | Pesiri et al. .................... 435/7.1 |
| 2005/0240069 A1 | 10/2005 | Polverejan et al. ............ 585/444 |
| 2005/0258766 A1 | 11/2005 | Kim ......................... 315/111.21 |
| 2005/0275143 A1 | 12/2005 | Toth |
| 2006/0051505 A1 | 3/2006 | Kortshagen et al. .......... 427/212 |
| 2006/0068989 A1 | 3/2006 | Ninomiya et al. ............. 502/339 |
| 2006/0094595 A1 | 5/2006 | Labarge |
| 2006/0096393 A1 | 5/2006 | Pesiri ......................... 73/863.21 |
| 2006/0105910 A1 | 5/2006 | Zhou et al. .................... 502/338 |
| 2006/0108332 A1 | 5/2006 | Belashchenko .......... 219/121.47 |
| 2006/0153728 A1 | 7/2006 | Schoenung et al. ............ 419/32 |
| 2006/0153765 A1 | 7/2006 | Pham-Huu et al. ............ 423/345 |
| 2006/0159596 A1 | 7/2006 | De La Veaux et al. ........ 422/151 |
| 2006/0166809 A1 | 7/2006 | Malek et al. |
| 2006/0211569 A1 | 9/2006 | Dang et al. |
| 2006/0213326 A1 | 9/2006 | Gollob et al. |
| 2006/0222780 A1 | 10/2006 | Gurevich et al. |
| 2006/0231525 A1 | 10/2006 | Asakawa et al. ................ 216/56 |
| 2007/0048206 A1 | 3/2007 | Hung et al. .................... 423/335 |
| 2007/0049484 A1 | 3/2007 | Kear et al. |
| 2007/0063364 A1 | 3/2007 | Hsiao et al. ........................ 264/5 |
| 2007/0084308 A1 | 4/2007 | Nakamura et al. .............. 75/346 |
| 2007/0084834 A1 | 4/2007 | Hanus et al. ................ 219/121.5 |
| 2007/0087934 A1 | 4/2007 | Martens et al. ................ 502/214 |
| 2007/0163385 A1 | 7/2007 | Takahashi et al. |
| 2007/0173403 A1 | 7/2007 | Koike et al. ................... 502/300 |
| 2007/0178673 A1 | 8/2007 | Gole et al. |
| 2007/0221404 A1 | 9/2007 | Das et al. |
| 2007/0253874 A1 | 11/2007 | Foret ........................ 422/186.07 |
| 2007/0292321 A1 | 12/2007 | Plischke et al. ............... 422/198 |
| 2008/0006954 A1 | 1/2008 | Yubuta et al. |
| 2008/0026041 A1 | 1/2008 | Tepper et al. |
| 2008/0031806 A1 | 2/2008 | Gavenonis et al. |
| 2008/0038578 A1 | 2/2008 | Li |
| 2008/0045405 A1 | 2/2008 | Beutel et al. |
| 2008/0047261 A1 | 2/2008 | Han et al. |
| 2008/0057212 A1 | 3/2008 | Dorier et al. |
| 2008/0064769 A1 | 3/2008 | Sato et al. |
| 2008/0104735 A1 | 5/2008 | Howland |
| 2008/0105083 A1 | 5/2008 | Nakamura et al. .............. 75/255 |
| 2008/0116178 A1 | 5/2008 | Weidman .................. 219/121.47 |
| 2008/0125308 A1 | 5/2008 | Fujdala et al. |
| 2008/0125313 A1 | 5/2008 | Fujdala et al. |
| 2008/0138651 A1 | 6/2008 | Doi et al. |
| 2008/0175936 A1 | 7/2008 | Tokita et al. |
| 2008/0187714 A1 | 8/2008 | Wakamatsu et al. |
| 2008/0206562 A1 | 8/2008 | Stucky et al. |
| 2008/0207858 A1 | 8/2008 | Kowaleski et al. |
| 2008/0248704 A1 | 10/2008 | Mathis et al. |
| 2008/0274344 A1 | 11/2008 | Vieth et al. |
| 2008/0277092 A1 | 11/2008 | Layman et al. ............... 165/281 |
| 2008/0277264 A1 | 11/2008 | Sprague |
| 2008/0277266 A1 | 11/2008 | Layman et al. .......... 204/157.15 |
| 2008/0277267 A1 | 11/2008 | Biberger et al. ......... 204/157.15 |
| 2008/0277268 A1 | 11/2008 | Layman ........................ 204/164 |
| 2008/0277269 A1 | 11/2008 | Layman et al. ............. 423/215.5 |
| 2008/0277270 A1 | 11/2008 | Biberger ....................... 204/164 |
| 2008/0277271 A1 | 11/2008 | Layman et al. ............... 422/130 |
| 2008/0280049 A1 | 11/2008 | Kevwitch et al. ............. 427/243 |
| 2008/0280751 A1 | 11/2008 | Harutyunyan et al. |
| 2008/0280756 A1 | 11/2008 | Biberger ....................... 502/232 |
| 2008/0283411 A1 | 11/2008 | Eastman et al. |
| 2008/0283498 A1 | 11/2008 | Yamazaki |
| 2009/0010801 A1 | 1/2009 | Murphy et al. |
| 2009/0054230 A1 | 2/2009 | Veeraraghavan et al. |
| 2009/0088585 A1 | 4/2009 | Schammel et al. |
| 2009/0092887 A1 | 4/2009 | McGrath et al. |
| 2009/0098402 A1 | 4/2009 | Kang et al. |
| 2009/0114568 A1 | 5/2009 | Trevino et al. |
| 2009/0162991 A1 | 6/2009 | Beneyton et al. |
| 2009/0168506 A1 | 7/2009 | Han et al. |
| 2009/0170242 A1 | 7/2009 | Lin et al. |
| 2009/0181474 A1 | 7/2009 | Nagai |
| 2009/0200180 A1 | 8/2009 | Capote et al. |
| 2009/0208367 A1* | 8/2009 | Calio et al. ..................... 422/26 |
| 2009/0209408 A1 | 8/2009 | Kitamura et al. |
| 2009/0223410 A1 | 9/2009 | Jun et al. |
| 2009/0253037 A1 | 10/2009 | Park et al. |
| 2009/0274903 A1 | 11/2009 | Addiego |
| 2009/0286899 A1 | 11/2009 | Hofmann et al. |
| 2009/0324468 A1 | 12/2009 | Golden et al. |
| 2010/0089002 A1 | 4/2010 | Merkel |
| 2010/0092358 A1 | 4/2010 | Koegel et al. |
| 2010/0124514 A1 | 5/2010 | Chelluri et al. |
| 2010/0166629 A1 | 7/2010 | Deeba |
| 2010/0180581 A1 | 7/2010 | Grubert et al. |
| 2010/0180582 A1 | 7/2010 | Mueller-Stach et al. |
| 2010/0186375 A1 | 7/2010 | Kazi et al. |
| 2010/0240525 A1 | 9/2010 | Golden et al. |
| 2010/0275781 A1 | 11/2010 | Tsangaris |
| 2011/0006463 A1 | 1/2011 | Layman |
| 2011/0052467 A1 | 3/2011 | Chase et al. |
| 2011/0143041 A1 | 6/2011 | Layman et al. |
| 2011/0143915 A1 | 6/2011 | Yin et al. |
| 2011/0143916 A1 | 6/2011 | Leamon |
| 2011/0143926 A1 | 6/2011 | Yin et al. |
| 2011/0143930 A1 | 6/2011 | Yin et al. |
| 2011/0143933 A1 | 6/2011 | Yin et al. |
| 2011/0144382 A1 | 6/2011 | Yin et al. |
| 2011/0152550 A1 | 6/2011 | Grey et al. |
| 2011/0158871 A1 | 6/2011 | Arnold et al. |
| 2011/0174604 A1 | 7/2011 | Duesel et al. |
| 2011/0243808 A1* | 10/2011 | Fossey et al. ................. 422/295 |
| 2011/0245073 A1 | 10/2011 | Oljaca et al. |
| 2011/0247336 A9 | 10/2011 | Farsad et al. |
| 2011/0305612 A1 | 12/2011 | Müller-Stach et al. |
| 2012/0023909 A1 | 2/2012 | Lambert et al. |
| 2012/0045373 A1 | 2/2012 | Biberger |
| 2012/0097033 A1 | 4/2012 | Arnold et al. |
| 2012/0122660 A1 | 5/2012 | Andersen et al. |
| 2012/0124974 A1 | 5/2012 | Li et al. |
| 2012/0171098 A1 | 7/2012 | Hung et al. |
| 2012/0308467 A1 | 12/2012 | Carpenter et al. |
| 2013/0213018 A1 | 8/2013 | Yin et al. |
| 2013/0280528 A1 | 10/2013 | Biberger |
| 2013/0281288 A1 | 10/2013 | Biberger et al. |
| 2013/0316896 A1 | 11/2013 | Biberger |
| 2013/0345047 A1 | 12/2013 | Biberger et al. |
| 2014/0018230 A1 | 1/2014 | Yin et al. |

FOREIGN PATENT DOCUMENTS

| | | | |
|---|---|---|---|
| GB | 1 307 941 A | 2/1973 | |
| JP | 56-146804 | 11/1981 | ............... B22F 9/08 |
| JP | 61-086815 A | 5/1986 | |
| JP | 62-102827 A | 5/1987 | |
| JP | 63-214342 A | 9/1988 | |
| JP | 1-164795 A | 6/1989 | |
| JP | 05-228361 A | 9/1993 | |
| JP | 05-324094 A | 12/1993 | |
| JP | 6-93309 A | 4/1994 | |
| JP | 6-135797 A | 5/1994 | |
| JP | 6-272012 A | 9/1994 | |
| JP | H6-065772 U | 9/1994 | |
| JP | 7031873 A | 2/1995 | |
| JP | 07-256116 A | 10/1995 | |
| JP | 8-158033 A | 6/1996 | |
| JP | 10-130810 A | 5/1998 | |

(56) References Cited

FOREIGN PATENT DOCUMENTS

| | | | |
|---|---|---|---|
| JP | 11-502760 A | 3/1999 | |
| JP | 2000-220978 A | 8/2000 | |
| JP | 2002-88486 A | 3/2002 | |
| JP | 2002-336688 A | 11/2002 | |
| JP | 2003-126694 A | 5/2003 | |
| JP | 2004-233007 A | 8/2004 | |
| JP | 2004-249206 A | 9/2004 | |
| JP | 2004-290730 A | 10/2004 | |
| JP | 2005-503250 A | 2/2005 | |
| JP | 2005-122621 A | 5/2005 | |
| JP | 2005-218937 A | 8/2005 | |
| JP | 2005-342615 A | 12/2005 | |
| JP | 2006-001779 A | 1/2006 | |
| JP | 2006-508885 A | 3/2006 | |
| JP | 2006-247446 A | 9/2006 | |
| JP | 2006-260385 A | 9/2006 | |
| JP | 2007-46162 A | 2/2007 | |
| JP | 2007-203129 A | 8/2007 | |
| SU | 493241 | 3/1976 | |
| TW | 200611449 | 4/2006 | |
| TW | 201023207 | 6/2010 | |
| WO | WO-96/28577 A1 | 9/1996 | |
| WO | WO 02/092503 A1 | 11/2002 | C01B 21/064 |
| WO | WO 2004/052778 A2 | 6/2004 | C01B 13/28 |
| WO | WO-2005/063390 A1 | 7/2005 | |
| WO | WO 2006/079213 A1 | 8/2006 | B01J 2/04 |
| WO | WO-2008/130451 A2 | 10/2008 | |
| WO | WO-2008/130451 A3 | 10/2008 | |
| WO | WO-2011/081833 A1 | 7/2011 | |

OTHER PUBLICATIONS

Derwent English Abstract for publication No. SU 193241 A, Application No. 1973SU1943286 filed on Jul. 2, 1973, published on Mar. 1, 1976, entitled "Catalyst for Ammonia Synthesis Contains Oxides of Aluminium, Potassium, Calcium, Iron and Nickel Oxide for Increased Activity," 3 pgs.
A. Gutsch et al., "Gas-Phase Production of Nanoparticles", Kona No. 20, 2002, pp. 24-37.
Dr. Heike Mühlenweg et al., "Gas-Phase Reactions—Open Up New Roads to Nanoproducts", Degussa ScienceNewsletter No. 08, 2004, pp. 12-16.
Coating Generation: Vaporization of Particles in Plasma Spraying and Splat Formation, M. Vardelle, A. Vardelle, K-I li, P. Fauchais, Universite de Limoges, 123 Avenue A. Thomas 87000, Limoges, F., Pure & Chem, vol. 68, No. 5, pp. 1093-1099, 1996.
H. Konrad et al., "Nanostructured Cu—Bi Alloys Prepared by Co-Evaporation in a Continuous Gas Flow," NanoStructured Materials, vol. 7, No. 6, 1996, pp. 605-610.
Kenvin et al. "Supported Catalysts Prepared from Mononuclear Copper Complexes: Catalytic Properties", Journal of Catalysis, pp. 81-91,(1992).
J. Heberlein, "New Approaches in Thermal Plasma Technology", Pure Appl. Chem., vol. 74, No. 3, 2002, pp. 327-335.
M. Vardelle et al., "Experimental Investigation of Powder Vaporization in Thermal Plasma Jets," Plasma Chemistry and Plasma Processing, vol. 11, No. 2, Jun. 1991, pp. 185-201.
National Aeronautics and Space Administration, "Enthalpy", http://www.grc.nasa.gov/WWW/K-12/airplane/enthalpy.html, Nov. 23, 2009, 1 page.
P. Fauchais et al., "Plasma Spray: Study of the Coating Generation," Ceramics International, Elsevier, Amsterdam, NL, vol. 22, No. 4, Jan. 1996, pp. 295-303.
P. Fauchais et al., "Les Dépôts Par Plasma Thermique," Revue Generale De L'Electricitie, RGE. Paris, FR, No. 2, Jan. 1993, pp. 7-12.
P. Fauchais et al, "La Projection Par Plasma: Une Revue," Annales De Physique, vol. 14, No. 3, Jun. 1989, pp. 261-310.
T. Yoshida, "The Future of Thermal Plasma Processing for Coating", Pure & Appl. Chem., vol. 66, No. 6, 1994 pp. 1223-1230.
Han et al., Deformation Mechanisms and Ductility of Nanostructured Al Alloys, Mat. Res. Soc. Symp. Proc. vol. 821, Jan. 2004, Material Research Society, http://www.mrs.org/s_mrs/bin.asp?CID=2670&DOC=FILE.PDF., 6 pages.
Nagai, Yasutaka, et al., "Sintering Inhibition Mechanism of Platinum Supported on Ceria-based Oxide and Pt-oxide-support Interaction," Journal of Catalysis 242 (2006), pp. 103-109, Jul. 3, 2006, Elsevier.
Babin, A. et al. (1985). "Solvents Used in the Arts," *Center for Safety in the Arts*: 16 pages.
Bateman, J. E. et al. (Dec. 17, 1998). "Alkylation of Porous Silicon by Direct Reaction with Alkenes and Alkynes," *Angew. Chem Int. Ed.* 37(19):2683-2685.
Carrot, G. et al. (Sep. 17, 2002). "Surface-Initiated Ring-Opening Polymerization: A Versatile Method for Nanoparticle Ordering," *Macromolecules* 35(22):8400-8404.
Chen, H.-S. et al. (Jul. 3, 2001). "On the Photoluminescence of Si Nanoparticles," *Mater. Phys. Mech.* 4:62-66.
Chen, W.-J. et al. (Mar. 18, 2008). "Functional $Fe_3O_4/TiO_2$ Core/Shell Magnetic Nanoparticles as Photokilling Agents for Pathogenic Bacteria," *Small* 4(4): 485-491.
Faber, K. T. et al. (Sep. 1988). "Toughening by Stress-Induced Microcracking in Two-Phase Ceramics," *Journal of the American Ceramic Society* 71: C-399-C401.
Fojtik, A. et al. (Apr. 29, 1994). "Luminescent Colloidal Silicon Particles," *Chemical Physics Letters* 221:363-367.
Fojtik, A. (Jan. 13, 2006). "Surface Chemistry of Luminescent Colloidal Silicon Nanoparticles," *J. Phys. Chem. B.* 110(5):1994-1998.
Gangeri, M. et al. (2009). "Fe and Pt Carbon Nanotubes for the Electrocatalytic Conversion of Carbon Dioxide to Oxygenates," *Catalysis Today* 143: 57-63.
Hua, F. et al. (Mar. 2006). "Organically Capped Silicon Nanoparticles With Blue Photoluminescence Prepared by Hydrosilylation Followed by Oxidation," *Langmuir* 22(9):4363-4370.
Ji, Y. et al. (Nov. 2002) "Processing and Mechanical Properties of $Al_2O_3$—5 vol.% Cr Nanocomposites," *Journal of the European Ceramic Society* 22(12):1927-1936.
Jouet, R. J. et al. (Jan. 25, 2005). "Surface Passivation of Bare Aluminum Nanoparticles Using Perfluoroalkyl Carboxylic Acids," *Chem. Mater.*17(11):2987-2996.
Kim, N. Y. et al. (Mar. 5, 1997). "Thermal Derivatization of Porous Silicon with Alcohols," *J. Am. Chem. Soc.* 119(9):2297-2298.
Kwon, Y.-S. et al. (Apr. 30, 2003). "Passivation Process for Superfine Aluminum Powders Obtained by Electrical Explosion of Wires," *Applied Surface Science* 211:57-67.
Langner, A. et al. (Aug. 25, 2005). "Controlled Silicon Surface Functionalization by Alkene Hydrosilylation," *J. Am. Chem. Soc.* 127(37):12798-12799.
Li, D. et al. (Apr. 9, 2005). "Environmentally Responsive "Hairy" Nanoparticles: Mixed Homopolymer Brushes on Silica Nanoparticles Synthesized by Living Radical Polymerization Techniques," *J. Am. Chem. Soc.* 127(7):6248-6256.
Li, X. et al. (May 25, 2004). "Surface Functionalization of Silicon Nanoparticles Produced by Laser-Driven Pyrolysis of Silane Followed by HF—$HNO_3$ Etching," *Langmuir* 20(11):4720-4727.
Liao, Y.-C. et al. (Jun. 27, 2006). "Self-Assembly of Organic Monolayers on Aerosolized Silicon Nanoparticles," *J.Am. Chem. Soc.* 128(28):9061-9065.
Liu, S.-M. et al. (Jan. 13, 2006). "Enhanced Photoluminescence from Si Nano-Organosols by Functionalization With Alkenes and Their Size Evolution," *Chem. Mater.* 18(3):637-642.
Luo, J. et al. (2008). "Core/Shell Nanoparticles as Electrocatalysts for Fuel Cell Reactions," *Advanced Materials* 20: 4342-4347.
Mignard, D. et al. (2003). "Methanol Synthesis from Flue-Gas $CO_2$ and Renewable Electricity: A Feasibility Study," *International Journal of Hydrogen Energy* 28: 455-464.
Neiner, D. (Aug. 5, 2006). "Low-Temperature Solution Route to Macroscopic Amounts of Hydrogen Terminated Silicon Nanoparticles," *J. Am. Chem. Soc.* 128:11016-11017.
Netzer, L. et al. (1983). "A New Approach to Construction of Artificial Monolayer Assemblies," *J. Am. Chem. Soc.* 105(3):674-676.

(56) References Cited

OTHER PUBLICATIONS

Park, H.-Y. et al. (May 30, 2007). "Fabrication of Magnetic Core@Shell Fe Oxide@Au Nanoparticles for Interfacial Bioactivity and Bio-Separation," *Langmuir* 23: 9050-9056.

Park, N.-G. et al. (Feb. 17, 2004). "Morphological and Photoelectrochemical Characterization of Core-Shell Nanoparticle Films for Dye-Sensitized Solar Cells: Zn—O Type Shell on $SnO_2$ and $TiO_2$ Cores," *Langmuir* 20: 4246-4253.

"Plasma Spray and Wire Flame Spray Product Group," located at http://www.processmaterials.com/spray.html, published by Process Materials, Inc., last accessed Aug. 5, 2013, 2 pages.

"Platinum Group Metals: Annual Review 1996" (Oct. 1997). Engineering and Mining Journal, p. 63.

Rahaman, R. A. et al. (1995). "Synthesis of Powders," in *Ceramic Processing and Sintering*. Marcel Decker, Inc., New York, pp. 71-77.

Sailor, M. J. (1997). "Surface Chemistry of Luminescent Silicon Nanocrystallites," *Adv. Mater.* 9(10):783-793.

Subramanian, S. et al. (1991). "Structure and Activity of Composite Oxide Supported Platinum—Iridium Catalysts," *Applied Catalysts* 74: 65-81.

Tao, Y.-T. (May 1993). "Structural Comparison of Self-Assembled Monolayers of *n*-Alkanoic Acids on the surfaces of Silver, Copper, and Aluminum," *J. Am. Chem. Soc.* 115(10):4350-4358.

Ünal, N. et al. (Nov. 2011). "Influence of WC Particles on the Microstructural and Mechanical Properties of 3 mol% $Y_2O_3$ Stabilized $ZrO_2$ Matrix Composites Produced by Hot Pressing," Journal of the European Ceramic Society (31)13: 2267-2275.

Zou, J. et al. (Jun. 4, 2004). "Solution Synthesis of Ultrastable Luminescent Siloxane-Coated Silicon Nanoparticles," *Nano Letters* 4(7):1181-1186.

U.S. Appl. No. 13/291,983, filed Nov. 8, 2011, for Layman et al.
U.S. Appl. No. 12/152,084, filed May 9, 2008, for Biberger.
U.S. Appl. No. 13/028,693, filed Feb. 16, 2011, for Biberger.
U.S. Appl. No. 12/943,909, filed Nov. 10, 2010, for Layman.
U.S. Appl. No. 12/152,111, filed May 9, 2008, for Biberger et al.
U.S. Appl. No. 12/151,830, filed May 8, 2008, for Biberger et al.
U.S. Appl. No. 12/968,248, filed Dec. 14, 2010, for Biberger.
U.S. Appl. No. 12/968,245, filed Dec. 14, 2010, for Biberger.
U.S. Appl. No. 12/968,241, filed Dec. 14, 2010, for Biberger.
U.S. Appl. No. 12/968,239, filed Dec. 14, 2010, for Biberger.
U.S. Appl. No. 12/969,128, filed Dec. 15, 2010, for Biberger.
U.S. Appl. No. 12/962,463, filed Dec. 7, 2010, for Leamon.
U.S. Appl. No. 12/961,030, filed Dec. 6, 2010, for Lehman.
U.S. Appl. No. 12/961,108, filed Dec. 6, 2010, for Lehman.
U.S. Appl. No. 12/961,200, filed Dec. 6, 2010, for Lehman.
U.S. Appl. No. 12/968,253, filed Dec. 14, 2010, for Biberger.
U.S. Appl. No. 12/968,235, filed Dec. 14, 2010, for Biberger.
U.S. Appl. No. 12/969,306, filed Dec. 15, 2010, for Lehman et al.
U.S. Appl. No. 12/969,447, filed Dec. 15, 2010, for Biberger et al.
U.S. Appl. No. 12/969,087, filed Dec. 15, 2010, for Biberger.
U.S. Appl. No. 12/962,533, filed Dec. 7, 2010, for Yin et al.
U.S. Appl. No. 12/962,523, filed Dec. 7, 2010, for Yin et al.
U.S. Appl. No. 12/001,643, filed Dec. 11, 2007, for Biberger et al.
U.S. Appl. No. 12/474,081, filed May 28, 2009, for Biberger et al.
U.S. Appl. No. 12/001,602, filed Dec. 11, 2007, for Biberger et al.
U.S. Appl. No. 12/001,644, filed Dec. 11, 2007, for Biberger et al.
U.S. Appl. No. 12/954,813, filed Nov. 26, 2010, for Biberger.
U.S. Appl. No. 12/954,822, filed Nov. 26, 2010, for Biberger.
U.S. Appl. No. 13/033,514, filed Feb. 23, 2011, for Biberger et al.
U.S. Appl. No. 13/589,024, filed Aug. 17, 2012, for Yin et al.
U.S. Appl. No. 13/801,726, filed Mar. 13, 2013, for Qi et al.

\* cited by examiner

METHODS AND APPARATUSES FOR NANO-MATERIALS POWDER TREATMENT AND PRESERVATION

CROSS-REFERENCE TO RELATED APPLICATIONS

This application claims priority from U.S. Provisional Patent Application Ser. No. 61/284,329, filed Dec. 15, 2009 and entitled "MATERIALS PROCESSING," which is hereby incorporated herein by reference in its entirety for all purposes.

FIELD OF THE INVENTION

The present invention relates to the field of nano-material powder capture and treatment. More specifically, the present invention relates to the apparatus for and method of nano-particle storage, preservation, and treatment.

BACKGROUND OF THE INVENTION

Nano-technologies normally use materials having sizes in the range of nano-meter. In recent years, researchers and industries have demonstrated promising applications of nano-materials to various fields, including bio-medical, fine chemicals, electronics, and catalysts.

The sizes of the nano-materials make them undetectable by human eyes. In addition, the nano-materials often contain active chemicals or bio-reactive substances that are potentially dangerous to the health of human beings and animals and also harmful to the environment. Especially, when the nano-materials are in the powder forms, the likelihood of dispersing the powders into the air is increased. If no apparatus and methods are used to ensure all the nano-materials that are made are properly accounted for, no one can assure that the spaces that are used for handling the nano-materials are free from nano-materials. Accordingly, apparatus and methods to ensure the nano-material powder accountability are needed to ensure the environmental and biological safety of preparing and handling nano-materials.

Nonetheless, current industries and research labs only use regular lab glassware and Schlenk flasks in the traditional wet chemical experiments for nano-materials preparations. Few, if any, apparatuses and methods have been designed for the purposes of nano-materials preservation and accounting for the powders of the nano-materials. Accordingly, apparatuses and methods ensuring nano-materials particles and powders accountability are needed.

SUMMARY OF THE INVENTION

Apparatuses for and methods of nano-material powder preservation, capture, and treatments are disclosed. The applications of the present disclosure ensure powder accountability of the nano-materials by preventing the nano-material from dispersing into the air, thereby preventing the workers and researchers from inhaling the nano-materials and protecting the public from unsafe exposure to the nano-materials.

In one aspect of the present invention, a method of preserving a nano-material is provided. The method comprises receiving a nano-material and mixing the nano-material with a fluid in a vessel until the nano-material is coated/encapsulated by the fluid. In some embodiments, the nano-material is comprised of nano-particles. Alternatively, the nano-material is comprised of nano-tubes, fullerenes, nano-clusters, nano-catalysts, or quantum dots. In some embodiments, the nano-material comprises a biological substance, an enzyme, or a catalyst. In an alternative embodiment, the nano-material comprises titanium carbides. In some embodiments, the method of preserving a nano-material further comprises a step of providing an inert gas. In some embodiments, the vessel is hermetically sealable. In some embodiments, the mixing is performed until the nano-material is substantially evenly distributed in the fluid. In some embodiments, the fluid comprises water and a surfactant. Alternatively, the fluid comprises an organic solvent, an inorganic solvent, or a combination thereof. In some embodiments, the nano-material is substantially evenly distributed in the fluid forming a colloidal fluid. In some embodiments, the step of mixing the nano-material with a fluid comprises a motion of tumbling, shaking, shear mixing, blending, swirling, or sonicating. In some embodiments, the method of preserving a nano-material further comprises a step of sampling using Dynamic Light Scattering (DLS).

In another aspect of the present invention, an apparatus for preserving a nano-material is provided. The apparatus for preserving a nano-material comprises a hermetically sealable vessel; and a nano-material and a fluid contained in the hermetically sealable vessel, wherein the fluid is configured to ensure the nano particles do not agglomerate, coalesce, or adhere to each other in the fluid. In some embodiments, the vessel has a funnel shape bottom. In some embodiments, the nano-material comprises nano-particles, nano-tubes, fullerenes, nano-clusters, nanocatalysts, or quantum dots. Alternatively, the nano-material comprises a biological substance, an enzyme, or a catalyst. In some embodiments, the fluid and the nano-material form a colloidal fluid. In some embodiments, the fluid comprises a surfactant, water, or a combination thereof. Alternatively, the fluid comprises an organic solvent, an inorganic solvent, or a combination thereof. In some embodiments, the hermetically sealable vessel is removably connected with a hermetically sealable receiver. In some embodiments, the hermetically sealable vessel is removably coupled with a fluid source. Alternatively, the hermetically sealable vessel is removably attached to a base. In some embodiments, the hermetically sealable vessel is pivotally rotatable attached to the base, wherein the hermetically sealable vessel is vertically movable from the base. Alternatively, the hermetically sealable vessel is removably coupled with a hermetically sealable mixer, wherein the hermetically sealable mixer is configured to increase the isolation/separation between the particles of the nano-material. In some embodiments, the sealable vessel is removably coupled with a gas inlet, wherein the gas inlet is configured to provide a gas to agitate the fluid, thereby increasing the isolation/separation between particles of the nano-material. Alternatively, the hermetically sealable vessel is removably coupled with a hermetically sealable multi-port switch, thereby forming an integrated sealable apparatus, wherein the hermetically sealable multi-port switch connects any two of the multi-ports. In some embodiments, the hermetically sealable multi-port switch contains three connectable ports, wherein the hermetically sealable multi-port switch connects any two of the three connectable ports, wherein a first connectable port connects to a mixer, wherein a second connectable port connects to a fluid outlet, and wherein a third connectable port connects to a channel configured to re-circulate the fluid in a sealed circle from the hermetically sealable vessel through the mixer and a cooling device back to the hermetically sealable vessel.

Figure 6:
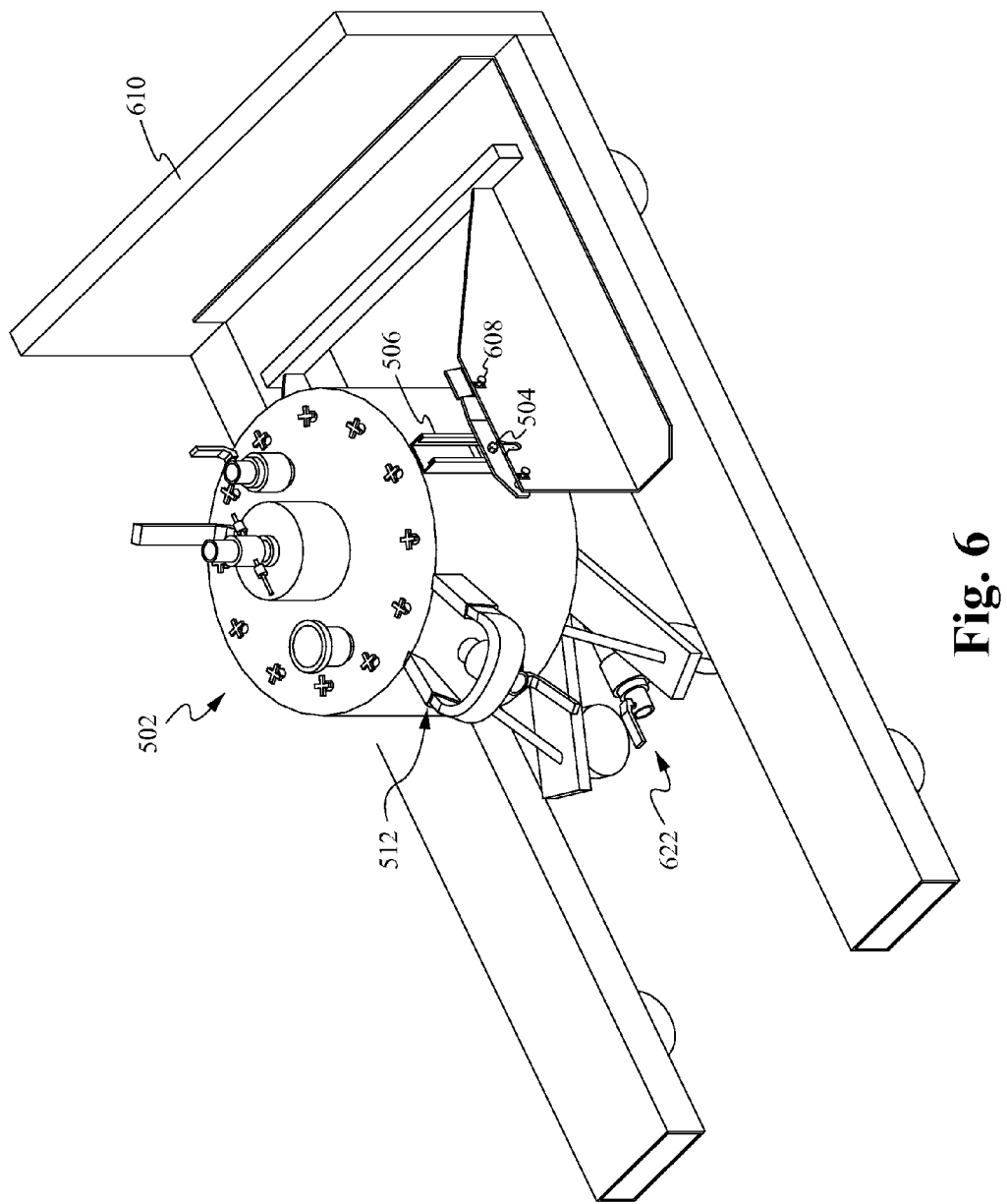

In yet another aspect of the present invention, a method of nano-material preservation and dispersion is provided. The method of nano-material preservation and dispersion comprises dispersing powders of a nano-material in a fluid contained in a hermetically sealable vessel until the powder is substantially evenly distributed in the fluid and surrounding the nano material with the fluid, thereby reducing the ability of the nano-material from escaping from the hermetically sealable vessel. In some embodiments, the nano-material comprises a nano-particle. In some embodiments, the fluid comprises water, a surfactant, or a combination thereof.

In another aspect of the present invention, a method of providing particle accountability of a nano-material comprises mixing the powders of the nano-material in a liquid contained in a hermetically sealed vessel until substantially all of the powders become a colloidal suspension in the liquid, and removing the colloid solution from the vessel, thereby making the vessel substantially free from the powders of the nano-material. In some embodiments, the nano-material is received from a hermetically sealable source. In some embodiments, the vessel is removable from the hermetically sealable source, thereby the vessel and hermetically sealable source are able to be concurrently and independently sealed. Alternatively, the vessel is pivotally rotatably secured on a movable base, further wherein the vessel is vertically movable from the base.

In a further aspect, a method of manufacturing nanoparticles comprising dispersing nanoparticles in a solution in an inert gas environment, making the solution into a slurry, and encapsulating the nanoparticles, such that the nanoparticles are prevented from exposing to atmospheric air. In an aspect, a method of nanomaterial treatment comprises producing nanoparticles in a hermetically sealable nanomaterial manufacturing apparatus, transferring the nanoparticles into a hermetically sealable nano-powder collection vessel, hermetically sealing the nanomaterial manufacturing apparatus and the hermetically sealable nano-powder collection vessel, and discoupling the hermetically sealable nano-powder collection vessel with the hermetically sealable nanomaterial manufacturing apparatus, such that the hermeticity of both the hermetically sealable nano-powder collection vessel and hermetically sealable nano-powder collection vessel are able to be maintained. In another aspect, a method of maintaining an inert gas environment for nanomaterial treatment comprises coupling a tubular component between a nanopowder producing device and a nanopowder collector, and purging the tubular component with a gas to eliminate a residual gas in the tubular component. In some embodiments, the gas comprises an inert gas or a reactive gas. In another aspect, a nanomaterial treating vessel comprises a container component, wherein the container component is able to be hermetically sealed and one or more connecting components couple with the container component, such that the vessel is able to receive a nanomaterial from a nanomaterial producing apparatus and is able to process the nanomaterial independently from the nanomaterial producing apparatus.

BRIEF DESCRIPTION OF THE DRAWINGS

FIG. 1 is a flow chart illustrating a method of treating a nano-material in accordance with some embodiments.

FIG. 2 shows a graphic illustration of a nano-materials treatment in accordance with some embodiments.

FIG. 3 illustrates one embodiment of an isometric view of a nano-materials treatment apparatus in accordance with some embodiments.

FIG. 4 is a schematic representation of portions of FIG. 3.

FIGS. 5 and 6 illustrate some of the alternative configurations of the apparatus 300 of FIG. 3.

FIG. 7 illustrates an overall setup of the apparatus for nano-materials treatments in accordance with some embodiments.

FIGS. 8A-D illustrate a method of using the nano-material treatment apparatus in accordance with some embodiments.

DETAILED DESCRIPTION OF THE INVENTION

Embodiments of the present application are directed to devices for and methods of nano-material powder preservation, capture, and treatments. Those of skill in the art will realize that the following detailed description of the devices for and methods of nano-material powder preservation, capture, and treatments are illustrative only and are not intended to be in any way limiting. Other embodiments of the devices, systems, and methods will readily suggest themselves to such skilled persons having the benefit of this disclosure.

Reference will now be made in detail to implementations of the devices for and methods of nano-material powder preservation, capture, and treatments as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of skill in the art having the benefit of this disclosure.

Apparatuses for, and methods of, nano-material powder preservation, dispersion, capture, and treatments are disclosed. The applications of the present disclosure ensure powder accountability of the nano-materials preventing the nano-material from dispersing into the air and being lost to collection and treatment. The method of treating a nano-material comprises receiving a nano-material and mixing the nano-material with a fluid in a vessel until the nano-material is sealed by the fluid. The apparatus for treating a nano-material comprises a hermetically sealable vessel containing a nano-material and a fluid, wherein the fluid is configured to increase the isolation between particles of the nano-material.

FIG. 1 is a flow chart illustrating one embodiment of a method 100 of treating a nano-material in accordance with the principles of the present invention.

At step 102, a nano-material is received either in inert gas or in air. The nano-materials include nano-particles, nano-tubes, fullerenes, nano-clusters, nano-catalysts, quantum dots, or any other proper materials in the range of nano-meter-size. Materials that are larger or smaller than the nano-meter-size are also applicable when proper.

At step 104, the received nano-materials are mixed with a liquid in inert gas or in air. The liquid includes water, surfactants, organic solvents, inorganic solvents, solutions that contain biological substance, solutions that contain metals, non-metals, ions, or any combinations thereof. Although the word liquid is used here, present disclosure is also applicable to any substance that has fluid-like movable properties, such as supercritical fluids, gases, aerosol, foam, sol, and gel.

Still referring to step 104, the step of mixing the nano-materials and the liquid can be achieved in many ways. For example, the mixing is able to be achieved by using a mixer to blend, mix, or disturb the liquid that contains the nano-materials until the nano-materials are substantially evenly distributed in the liquid. The mixer can be installed in a main reaction vessel. Alternatively, the mixer can be in a separate unit connected to the main reaction vessel. Further, the mixer can contain various types of mixers including shear mixers, mixers containing blades, vortex mixers, ultrasonic mixer, or any other mixer that can properly mix the liquid and nano-materials to become a homogeneously-like colloid or liquid. In some alternative embodiments, the mixing can be achieved by human labors or mechanical movements, such as manually rotationally tumbling the vessel when mounted in the base 610 (FIG. 6). A person skilled in the art would appreciate that the mixing can be achieved by any motions that can disperse the nano-materials in the liquid. The motions include, but are not limited to, tumbling, shaking, shear mixing, blending, swirling, or sonicating. In some embodiments, further mixing steps are performed to ensure that the nano-materials are thermodynamically and/or homogeneously dispersed in the solution.

At step 105, the mixture is sampled for quality of dispersion. At step 106, the mixing of the nano materials and the liquid are continued until the nano-materials are substantially evenly dispersed in the liquid. The well-dispersed nano-materials in the liquid make the liquid a colloid or colloid-like liquid, emulsion, or solution.

The step(s), in part or as a whole, of method 100 can be operated under inert gas environments, such as nitrogen gas, helium, or argon. Alternatively, the step(s) can be performed under air. The inert gases include argon, nitrogen, helium, or any other non-reactive gas. Alternatively, gases containing chemicals that can form protective layer(s) of the nano-materials can be employed, such as chemicals having single or multi-dentate sites and chemicals having chelating and coordinating abilities. Additional pressure, heating, or cooling can also be applied when required. The nano-materials liquid mixture can be sampled and analyzed. In some embodiments, Dynamic Light Scattering (DLS) is employed to analyze the mixture.

Figure 2:
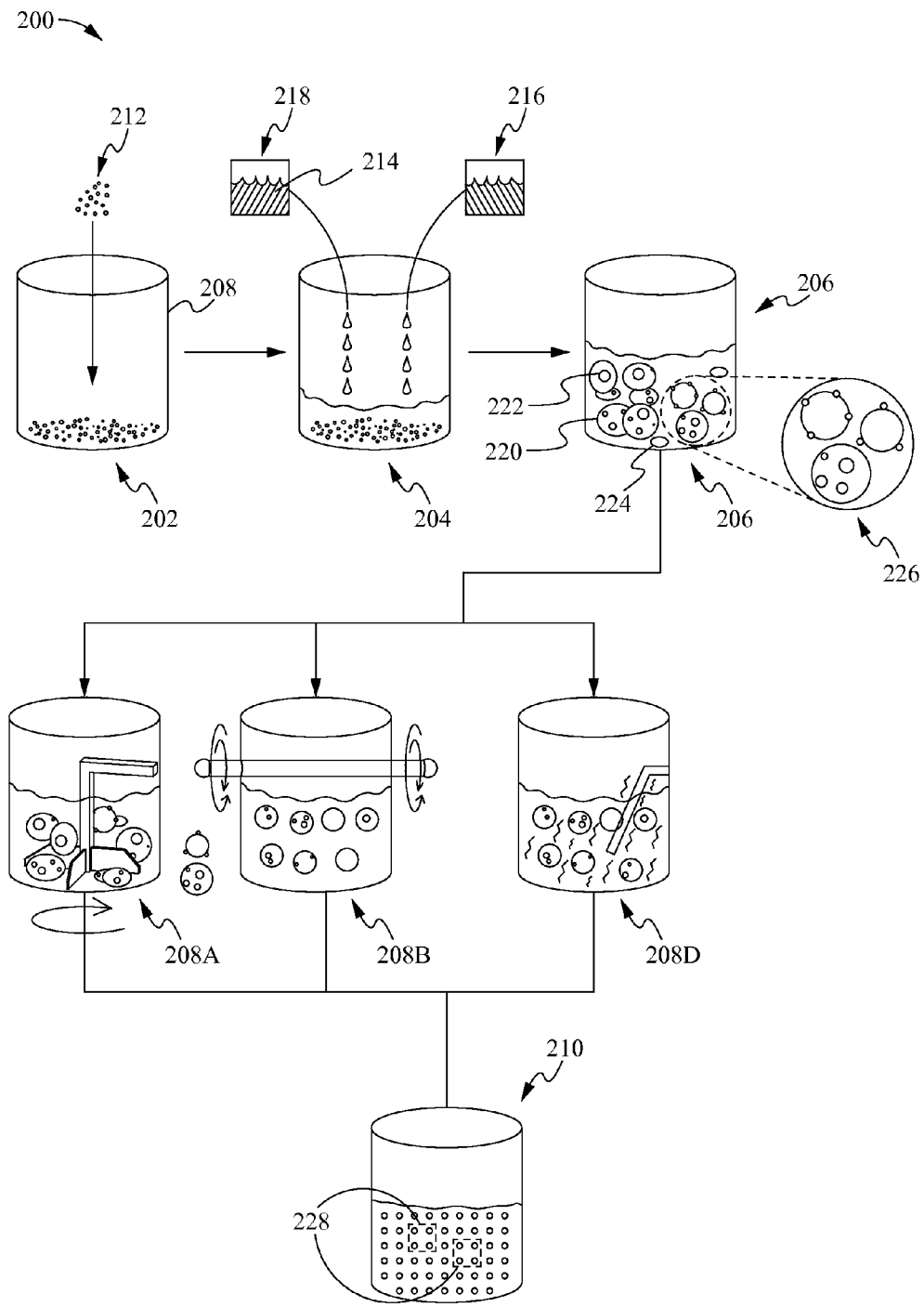

FIG. 2 shows a graphic illustration of one embodiment of nano-materials treatment 200 in accordance with the principles of the present disclosure. At step 202, vessel 208 receives nano-materials 212. At step 204, liquid 218 is added to the nano-material 212. In some embodiments, the liquid 218 includes water 214, surfactants 216, organic solvents, inorganic solvents, any combinations thereof, or any other proper liquids that can make the nano-materials 212 substantially evenly distributed in the liquid 218. At step 206, after the liquid 218 is added, the nano-materials are partially mixed with the liquid 218 forming nano-materials/liquid chunks 226, so the nano-materials are not evenly distributed in the liquid. Some unit of surfactant or solution contains multi-particles of nano-materials 220, some contains one particle of nano-materials 222, and some do not contain any nano-materials 224. The nano-materials can be either enclosed by the liquid or on the surfaces of the liquid. A person skilled in the art will appreciate that surfactants are able to include compounds that are able to lower the surface tension of a liquid, allowing easier spreading, and lowering of the interfacial tension between two liquids, or between a liquid and a solid. Further, surfactants are able to act as detergents, wetting agents, emulsifiers, foaming agents, and dispersants. At step 208, the nano-materials and the solution mixture are further mixed to make the nano-materials more evenly distributed in the liquid. The mixing of step 208 can be achieved by a commercially available mixer, such as the one that has a rotating mixing blade as shown in 208A. Alternatively, the mixing can be achieved by shaking the vessel as shown in 208B. In some embodiments, the shaking of the vessel is performed by human force. In other embodiments, the shaking is performed by any proper mechanical forces. Alternatively, the mixing is achieved by sonication, which is shown in 208D, and such individual mixing methods can be performed either sequentially or simultaneously. The step of mixing the nano-material with a fluid as described above can be any motions that make the nano-material more homogeneously distributed in the liquid. The motion can include, but not limited to, tumbling, shaking, shear mixing, blending, swirling, or sonicating. At step 210, the nano-materials 218 are evenly distributed in the liquid 210 forming a colloid, colloid-like, or emulsion solution 228.

Figure 3:
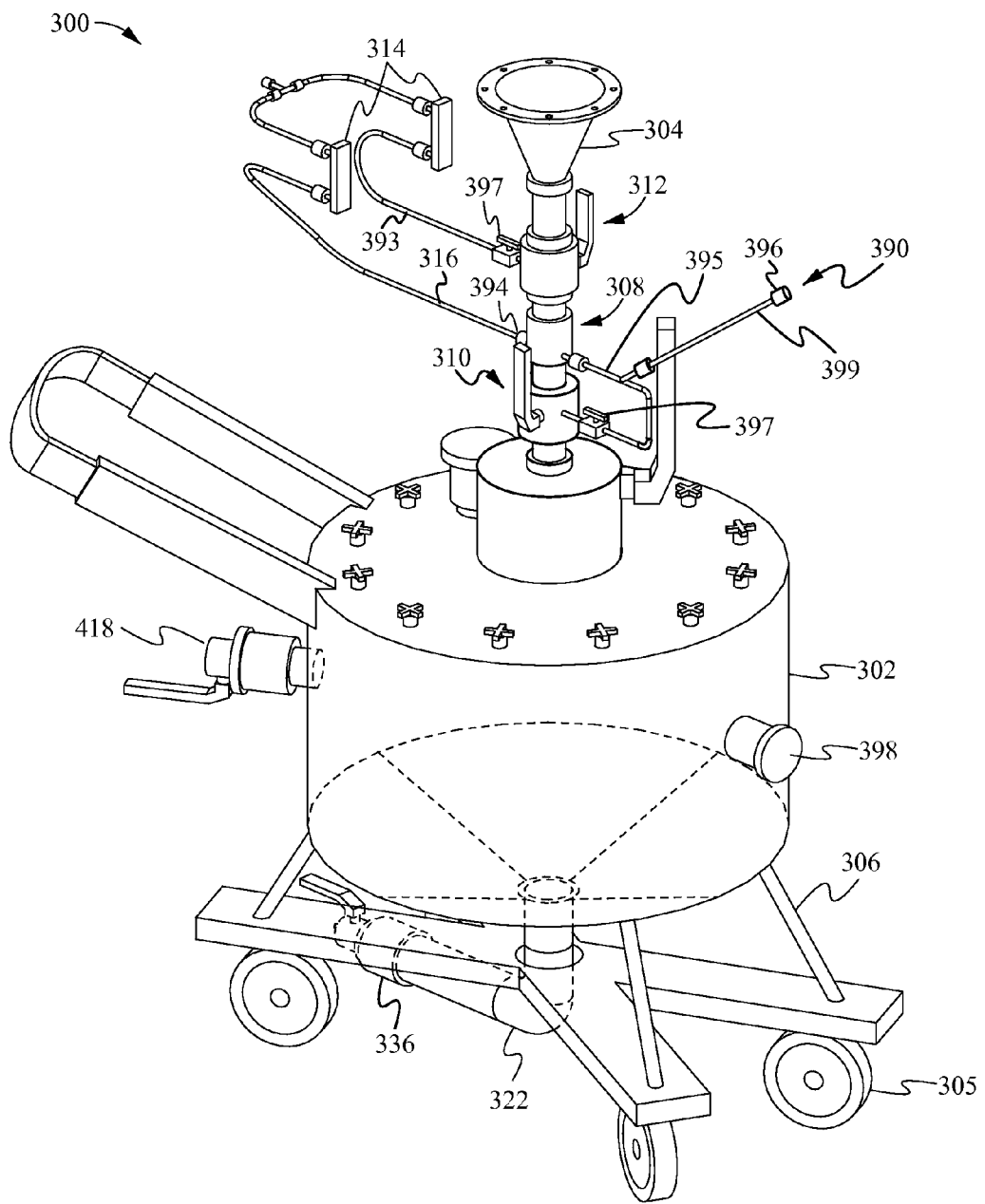

FIG. 3 illustrates one embodiment of an isometric view of a nano-materials treatment apparatus in accordance with the principles of the present disclosure.

Figure 7:
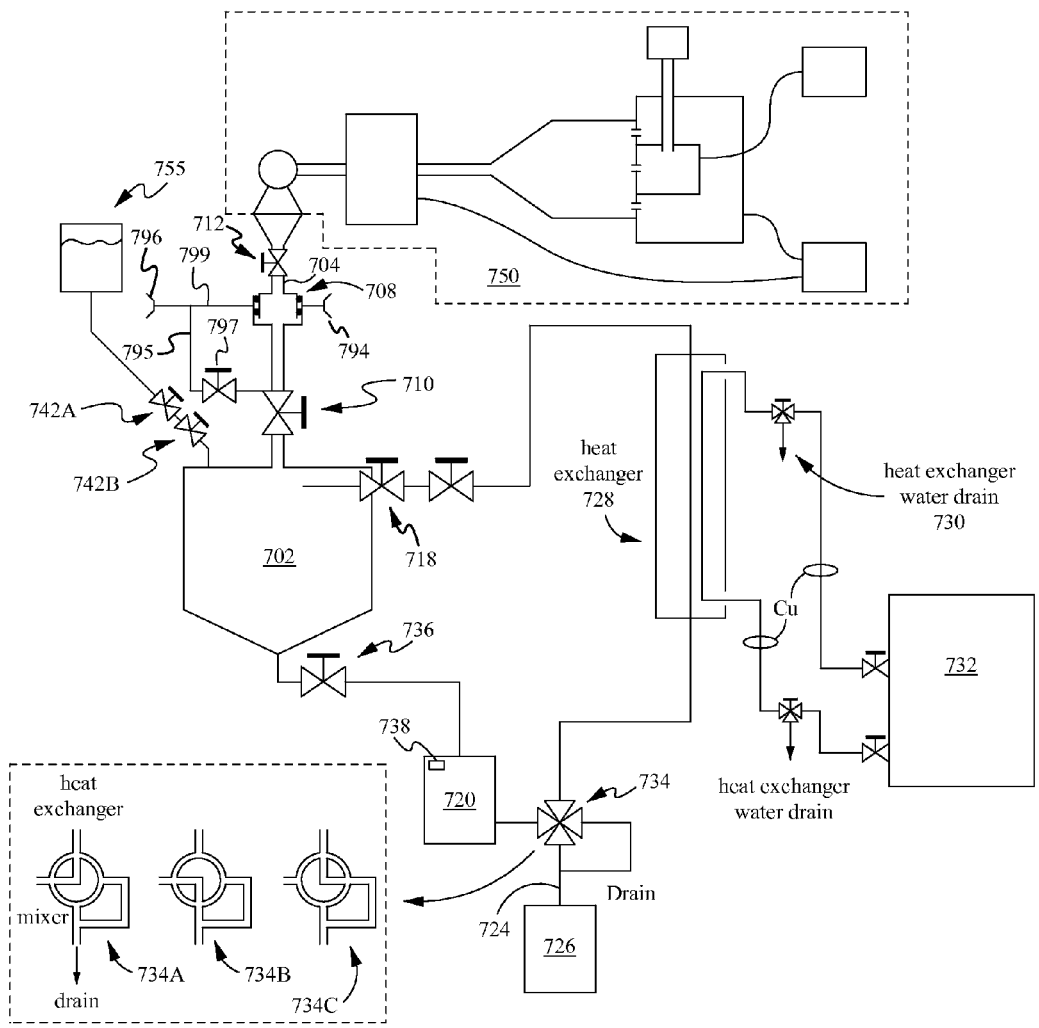

An apparatus 300 for treating the nano-materials includes a vessel 302, a receiver 304, and a base 306. The receiver 304 removably attaches to the vessel 302. In some embodiments, the connection between the receiver 304 and the vessel 302 includes valves on both the connector end nearest the receiver 304 and the connector end nearest the vessel 302. When the valves are closed, the vessel 302 and the receiver 304 can be in independent hermetic sealed conditions preventing air from leaking into or the nano-materials getting out of the vessel 302 or receiver 304, which can connect to nano-material preparation chambers. In some embodiments, the receiver 304 is in a funnel-like shape. A narrower end of the receiver 304 is coupled to the vessel 302 to facilitate the transferring of the materials via valves 310, 312, and sliding coupling 308. The wider end of the receiver can attach to other nano-materials reaction chambers or storage places. For example, the receiver can directly attach to a nano-materials preparation chamber 750 (FIG. 7). The valves of the receiver 304 (the valve 312) and the vessel 302 (the valve 310) are closed before the receiver 304 and the vessel 302 attach to each other in order to maintain a hermetically sealed or oxygen free environment. When the receiver 304 is coupled to the vessel 302 via sliding coupling 308, the nano-materials prepared in the chamber 750 (FIG. 7) or other storage places in hermetically sealed or air-free conditions can be transferred into the hermetically sealed or air-free reaction vessel 302 directly without the risks of exposing the nano-materials into the air. This setup provides several advantages that the traditional glassware or traditional Schlenk lines cannot provide. First, the direct connections between the nano-material storage places, handling places, or preparing chambers to the vessel 302 provide a direct transferring channel, which is an isolated transfer channel without the risk of exposing the nano-materials into the environment. After the completion of the transferring, the nano-material residue remaining on the surface of the receiver can be washed down with solution or any other proper solvents or liquid to the vessel 302. As such, no remaining powder is left on the receiver or transferring flask. Accordingly, the methods and apparatus of the present disclosure provide promising powder accountability. Second, the vessel 302 is removably coupled to the receiver 304 via sliding coupling 308. The nano-materials preservation can be performed in the vessel 302 independent from the storage places or preparing chamber 750 (FIG. 7). The feature that the nano-materials treatments can be performed independently from the preparing chamber 750 or storage places prevents the likelihood of contaminating the preparing chamber 750 or storage places with undesired chemicals or solutions. For example, some of the nano-materials treating chemicals contain water, which can be reactive to some of the precursor reactants for preparing the nano-materials. As such, if the nano-materials treating processes are not performed in isolation, the water vapors or molecules used for treating the nano-materials can contaminate the nano-materials preparing chamber 750.

Figure 5:
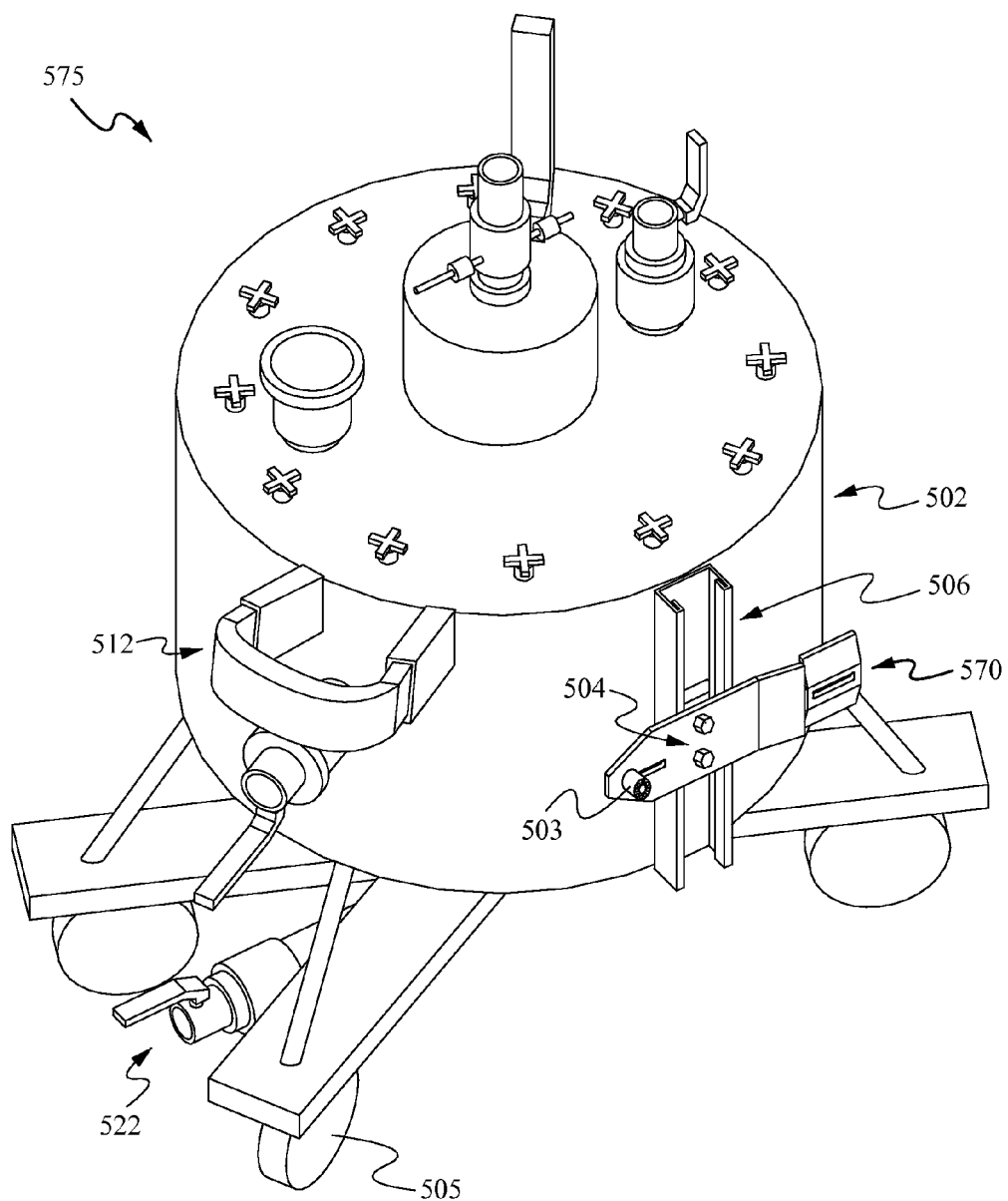

Still referring to FIG. 3, the base 306 is coupled with the vessel 302. In some embodiments, the base 306 includes wheels 305. In some embodiments, the vessel 302 is unmovably attached to the base 306. In some embodiments, the vessel 302 is removably attached to a base 610 (FIG. 6). In FIGS. 5 and 6, one or more bolts 504 secure the position of a mounting arm 570 used to position vessel 502 on the base 610, and the mounting arm 570 is vertically movable on the vessel 502 along a track 506. The bolts 504 are adjustably secured in the track 506. The bolts 504, the tracks 506, and the mounting arm 570 are shown as examples, and various designs to position vessel 502 relative to base 610 can be employed. The tracks, bolts, and mounting arm can be designed to move in any directions and securable in any means as long as the function of positioning and/or securing can be provided. In some embodiments, the vessel 502 includes a pivotal point 503 mounting on the mounting arm 570 (FIG. 5). In some embodiments, the pivotal point 503 comprises a ball bearing allowing a rotational movement of the vessel 502 relative to the base 610. In some embodiments, the pivotal point 503 allows the vessel 502 to rotate in a circular motion, such as rotating 72°, 90°, 180°, 360° or any other angles, such that the content inside the vessel 502 is able to be mixed. For example, a fluid that is inside the vessel 502 is able to be tumbled by a circular movement of the vessel 502. A person skilled in the art would appreciate that the movement is able to be performed in an unidirectional/bidirectional rotation and/or in a constant or irregular speed/motion. In some embodiments, the vessel 502 comprises a handle 512, which is able to be used to transport the vessel 502 by wheels 505. In some embodiments, the vessel 502 comprises a lock 608 (FIG. 6), such as a rotational lock, which is able to be used to secure the vessel 502 from further rotational movements. In some embodiments, the one or more bolts 504 and the track 506 described above are able to provide a function allowing a user to adjust the vessel 502 to a position substantially in the center of gravity to facilitate the circular rotational movements described above.

Figure 4:
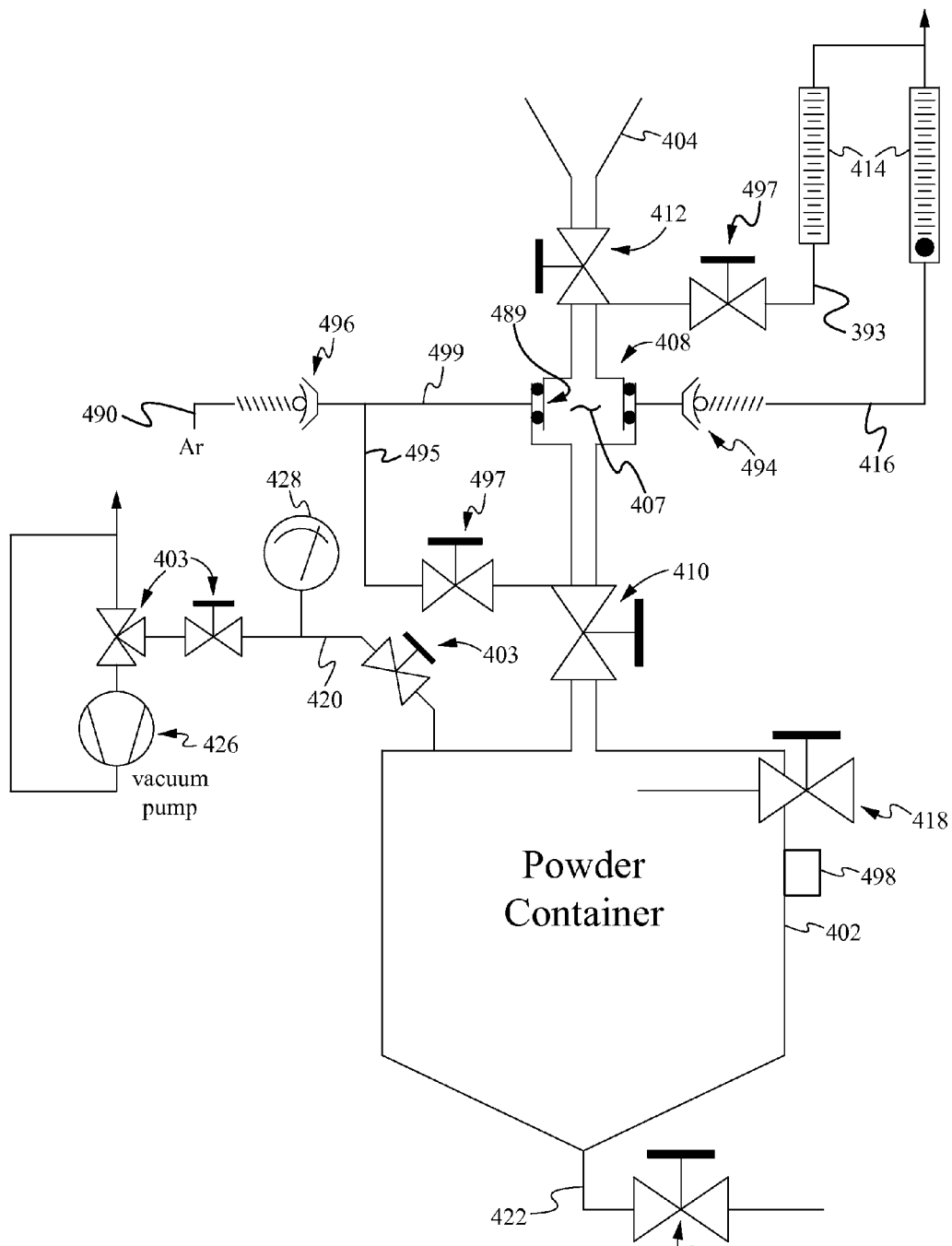

FIG. 4 is a schematic representation of portions of FIG. 3. FIG. 4 is able to be read together with FIG. 3. The vessels 302 and 402 have conical or funnel shape ends. The funnel shape ends of the vessels 302, 402 can be the bottom of the vessels 302, 402, which facilitate the outputting of the nano-materials from the vessels 302, 402. The contents in the vessel 302, 402 slide down along the angled wall of the funnel shape ends of the vessels. The funnel shape ends connect to outlets 322, 422 for product outputs. The outlets 322, 422 can connect to valves 436 and 336 and/or connect to other containers in a detatchable and sealable manner.

The vessels 302, 402 are able to be connected with various piping ducts or apparatus. As described above, the vessels 302 and 402 can connect to the receivers 304 and 404. Additionally, vessels 302 and 402 can optionally connect to the gas meters 314 and 414, valves 410 and 403, sliding hermetic coupling 308/408, gas inlets 399/499, sealable port 418, and vacuum components 426. In some embodiments, a window 398 is able to be included. In some embodiments, the adaptor to connect the vessel valve 410 with the reactor valve 412 is able to be a sliding coupling 408. The valve 410 is able to be a valve that hermetically isolates the powder collection vessel from atmosphere when the vessel is disconnected and removed from the powder manufacturing tool, such as a nano-material preparation apparatus 750 (FIG. 7). In some embodiments, the valve 412 isolates the manufacturing tool from atmosphere when the vessel is removed. In some embodiments, a valve 497 can be included. The valve 497 can provide inert purge gas to a power collection tube 407 to prevent an oxidation reaction of the air sensitive materials when the valve 410 is opened. The purge flow is able to be measured and regulated by the flow meter 414. The windows 398, 498 allow the status inside the vessel 302 to be observed. A person skilled in the art would appreciate that one or more illuminating devices, such as LED, are able to be equipped on the vessel to facilitate the observation. Any of the above-mentioned components can be included in the channels between the receiver 304, 404 and the vessel 302, 402 or inside the vessel itself. The gas meter 314, 414 and a gas source are able to be coupled with the sliding hermetic coupling 308 via connectors 394 and 396.

In some embodiments, the one or more gas inlets 390/490 provide inert gas, such as argon, nitrogen, and helium to provide an inert gas environment to the vessels 302, 402 and purge the system with the inert gas. Alternatively, the gas inlet 390/490 provides positive pressure protective gases, or reactive gases. In some embodiments, the interstitial space between the o-rings 489 in the sliding hermetic coupling 408 is purged with the gas to eliminate any air ingress in the event of a leak across the o-rings. In some embodiments, the gas meters 314 and 414 regulate the flow required and control the gas release rates. In some embodiments, any residual atmosphere can be purged from powder transfer tube 407 by opening valves 497 and flowing the inert gas through tube 407 and out flow measuring device 414. In some embodiments, the vessels 302 and 402 and other components are made durable to endure a negative pressure (e.g., a vacuum), and a vacuum component 426 is able be included. The vacuum components 426 can further contain pressure gauge 428. Further, the port 418 is able to be a fluid return port and externally coupled to the return lines of one or more stirrers (not shown in the figures). The stirrers are able to be used to mix the nano-materials with the liquids discussed above.

FIG. 5 illustrates a vessel unit 575, which is able to be removably attached to the base 610 (FIG. 6). In some embodiments, the base 610 comprises a pallet lifter, such that the vessel unit 575 is able to be lifted to facilitate the rotational movements described above. (More detail is described in FIG. 8) In some embodiments, the vessel 502 comprise a handle 512, which is able to be used to transport (e.g., pull and/or drag) the vessel 502 by wheels 505.

FIG. 7 illustrates one embodiment of a nano-materials preparation apparatus in accordance with the principles of the present disclosure.

A nano-material treating vessel 702 is similar to vessels 302, 402, 502 in FIGS. 3-6 respectively. The nano-materials can be prepared in the preparation chamber 750. After the nano-materials are made, the powder of the nano-materials can be transferred to the receiver 704. Subsequently, the nano-materials are received by the vessel 702 from the receiver 704. After the vessel 702 receives the nano-materials, the vessel 702 can be sealed at valves 710 and removed from the connection with the receiver 704. In some embodiments, the sliding coupling 708 is used to join the vessel 702 to a manufacturing tool, such as a nano-material preparation apparatus 750, via collection cone 704/404 (FIG. 4) and valve 712/412. The area between the O-rings in the coupling is able to be purged with a flow of inert gas, which is able to be above atmosphere pressure and keeps air from crossing the seal boundary in the event when there is a leak. The supply for the inert gas comes in through 490, 496, and 499 and the flow is able to be regulated by a flow control meter, such as meter 414 (FIG. 4).

Next, the solutions containing surfactants and/or liquids can be introduced from the liquid tank 755 to the vessel 702 to disperse or preserve the nano-materials. After the liquids are introduced from the liquid tank 755, the valves 742A and 742B can be closed and disconnected from one another. The process of mixing, as mentioned above, can be performed. To ensure that the nano-materials are well dispersed in the liquid, the products are optionally transferred to an independent mixer 720. The mixer can further contain a port 738 for sampling. The sample can be analyzed by any particle distribution analytical instruments, such as DSL or any other proper analytical instruments. If the sample passes required quality standard, the products are transferred to a detatchable/removable ship container 726 for further processing or storage. If the sample does not reach required quality standard, the products are transferred back to the vessel 702 for further processing. The mixer 720 can connect to a multi-way adaptor 734. In some embodiments, the adaptor 734 can connect the channels between the mixer 720 and heat exchanger 728 as shown in 734A, mixer 720 and the outlet 724 as shown in 734B, or outlet 724 and heat exchanger 728 as shown in 734C. When the adaptor 734 connects the channel of the mixer 720 and the heat exchanger 728, the solution containing the nano-materials and the liquid in the vessel 702 can be circulated through the mixer 720, heat exchanger 728, and back to vessel 702. By going through the heat exchanger 728, the heat of the solution generated in the mixing can be removed. The heat exchanged in the heat exchanger 728 is subsequently removed in the chiller 732. When the adaptor 734 connects the channel of the mixer 720 and the outlet 724, the products are outputted and sent to be used or stored. When the adaptor 734 connects the channel of the outlet 724 and the heat exchanger 728, the gas from gas supply, such as gas supply inlet 799, can come to push the remaining products out of the outlet 724. In some embodiments, the adaptor 734 comprises a selector valve, which is able to be switched to drain either the collector/mixer or the heat exchanger into a collection vessel via gravity.

Still referring to FIG. 7. In some embodiments, the nano-material treatment apparatus disclosed in the present disclosure is used with a nano-material preparation apparatus 750. In some embodiments, the nano-material preparation apparatus 750 can be the one described in the related U.S. patent application Ser. No. 12/152,097, titled GAS DELIVERY SYSTEM WITH CONSTANT OVERPRESSURE RELATIVE TO AMBIENT TO SYSTEM WITH VARYING VACUUM SUCTION, which is hereby incorporated entirely into present disclosure.

Figure 8A:
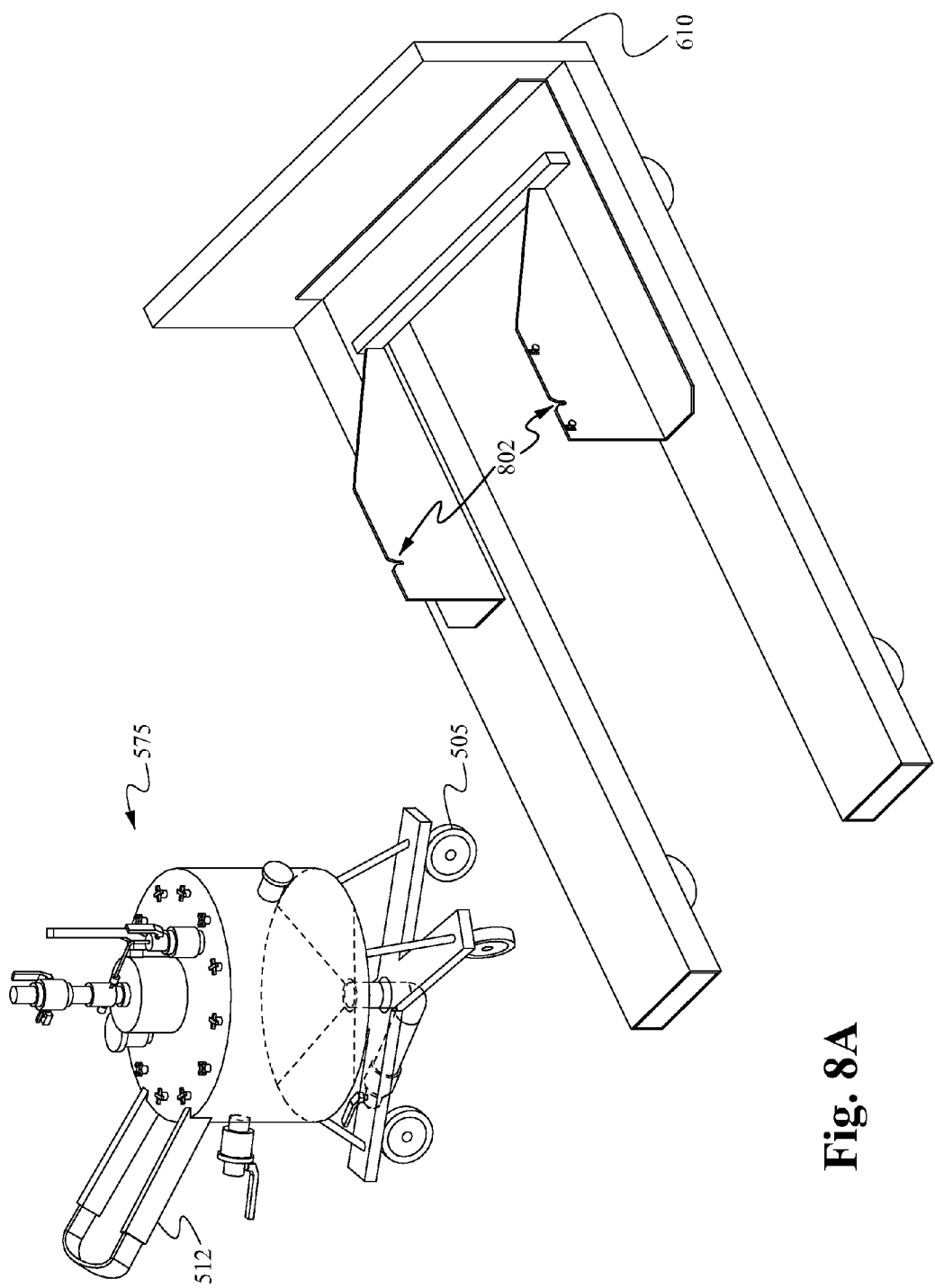
Figure 8B:
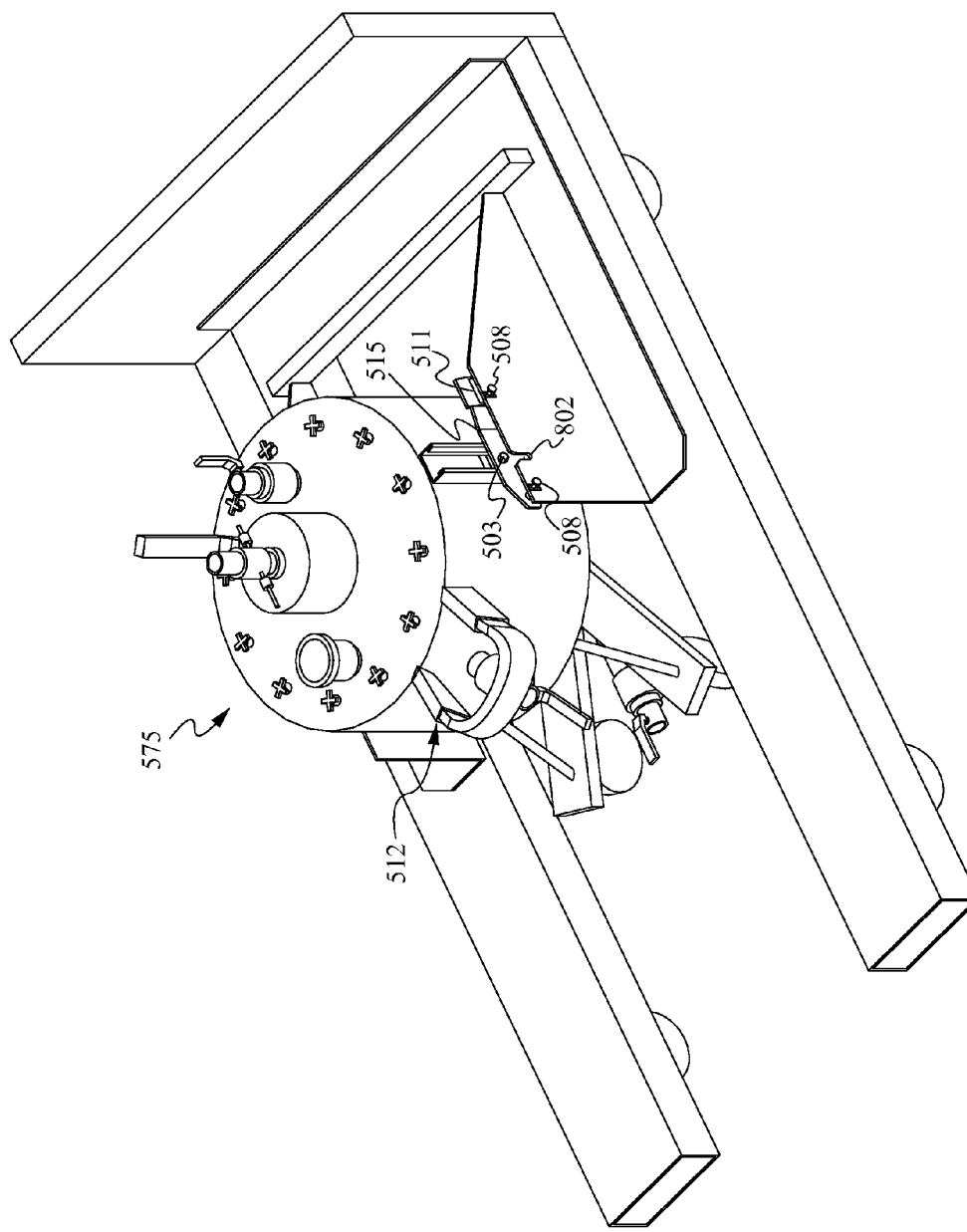
Figure 8C:
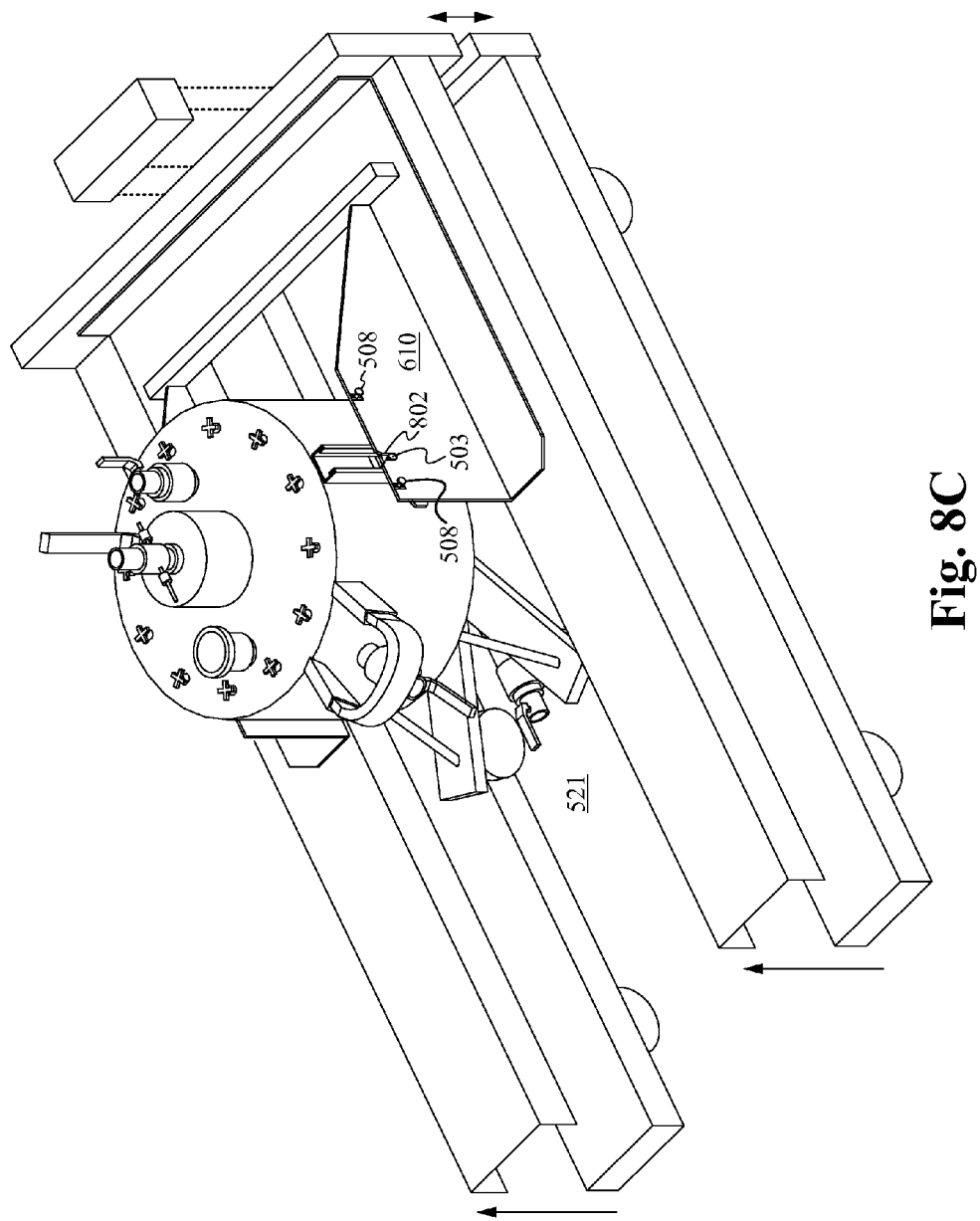
Figure 8D:
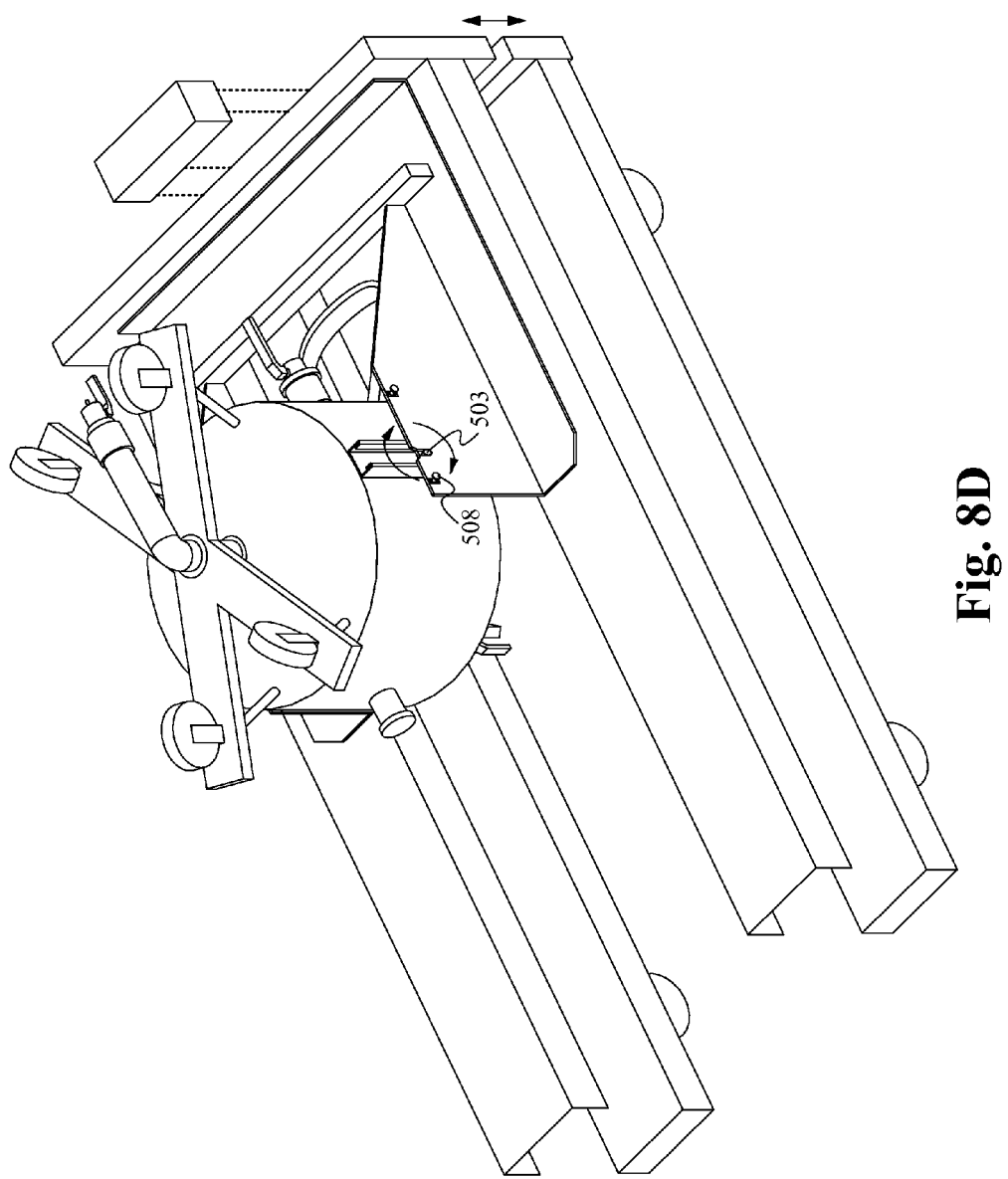

FIGS. 8A-D illustrate a method of using the nano-material treatment apparatus in accordance with some embodiments. The numbers that are used in FIGS. 8A-D for identification are the same numbers that are used in FIGS. 5 and 6. FIG. 8A shows a vessel assembly 575 that is separated/detached from the base 610. The base 610 is able to be a palette lifter. The vessel 575 is able to be rolled to access the base 610 by using the handle 512 and the wheels 505. As shown in FIG. 8B, the pivotal points 503 are able to be placed in the grooves 802, such that the vessel is able to rotate circularly along the pivotal points 503. The rotational lock 508 can be used to secure/lock by using securing means, so that the vessel 575 is prevented from rotating or spinning. In some embodiments, the securing means comprises one or more bolt on the pivotal point 503 capable of protruding into the hole 511 on a metal plate 515, so that the vessel 575 is secured from rotating. In some embodiments, a rotational lock 508 is left unused when the vessel 575 is in an upright position. FIG. 8C shows that the base 610 is in a lifted position and the vessel 575 is in the air having space 521, so that the vessel 575 is able to freely rotate along the pivotal points 503. The rotational lock 508 is able to be in an engaged position, so that the vessel 575 is able to be fixed in a stable position preventing from a rotation. The FIG. 8D shows that the vessel 575 is rotated and flipped in an upside-down position along the pivotal point 503. The vessel is able to be secured in the upside-down position by locking the rotational lock 508.

In the following, some examples in accordance with some embodiments of the present invention are provided. In some embodiments, a system comprised of a hermetically sealed powder manufacturing machine removably coupled to a hermetically sealed powder collection vessel. Once the powder has been collected in the vessel, the vessel can be hermetically disconnected and removed from the manufacturing tool while maintaining the hermeticity (hermetic integrity) of both the manufacturing tool and the vessel.

In some embodiments, other hardware is able to be used to replace the above described vessel onto the powder manufacturing tool. Similar methods are able to be used to maintain an inert gas environment. The hardware is able to comprise a container containing a defined atmosphere (inert or reactive). The interface connection can be purged with inert gas to remove/replace residual atmosphere in the connection of the hardware and proactively/dynamically maintain the inertness of the connection.

In some embodiments, a vessel capable of being moved to a remote processing location is provided. Further processing steps (such as solvating, mixing, dispersing, preserving, coating, quality sampling, cooling, dispensing) can be performed inertly within this vessel or outside the vessel with the aid of external, inert connections to supplemental processing hardware. This vessel is able to be not only an inert powder collection vessel but also able to be an inert processing vessel whereby the powder can be further treated without transfer or risk of disturbing the engineered environment inside the vessel.

The following description is presented to enable one skilled in the art to make and use the invention and is provided in the context of a patent application and its requirements. Various modifications to the described embodiments will be readily apparent to those persons skilled in the art and the generic principles herein may be applied to other embodiments. Thus, the present invention is not intended to be limited to the embodiment shown but is to be accorded the widest scope consistent with the principles and features described herein.

A person skilled in the art would appreciate that the nano-materials contain any material in the size of nano-meter. Although the term "nano-material(s)" is used here, the inventors do not intend to limit the applications of the present disclosure to nano-meter size materials. Any materials that have a size larger or smaller than the nano-materials are applicable with the present disclosure. Further, the term nano-materials used in the present disclosure include both particles and powders. These two terms are used equivalently. The present invention may apply to a wide variety of powders and particles. Powders that fall within the scope of the present invention may include, but are not limited to, any of the following: (a) nano-structured powders (nano-powders), having an average grain size less than 250 nanometers and an aspect ratio between one and one million; (b) submicron powders, having an average grain size less than 1 micron and an aspect ratio between one and one million; (c) ultra-fine powders, having an average grain size less than 100 microns and an aspect ratio between one and one million; and (d) fine powders, having an average grain size less than 500 microns and an aspect ratio between one and one million. Further, the terms of solution(s), liquid(s), solvent(s) disclosed in the present disclosure are all interchangeable.

What is claimed is:

1. An apparatus for preparing a nano-material and fluid mixture comprising:
   a. a hermetically sealable vessel;
   b. a hermetically sealable receiver coupled to the hermetically sealable vessel and to a nano-material source, wherein the hermetically sealable receiver allows nano-material to transfer from the nano-material source into the hermetically sealable vessel; and
   c. a fluid source coupled to the hermetically sealable vessel, wherein the hermetically sealable vessel is configured to receive fluid from the fluid source and the fluid increases the isolation between particles of the nano-material transferred into the hermetically sealable vessel.

2. The apparatus of claim 1, wherein the vessel has a funnel shape bottom.

3. The apparatus of claim 1, wherein the nano-material comprises a nano-particle, a nanotube, a fullerene, a nano-cluster, a nanocatalyst, or a quantum dot.

4. The apparatus of claim 1, wherein the nano-material comprises a biological substance, an enzyme, or a catalyst.

5. The apparatus of claim 1, wherein the fluid and the nano-material form a colloidal fluid.

6. The apparatus of claim 1, wherein the fluid comprises a surfactant, water, or a combination thereof.

7. The apparatus of claim 1, wherein the fluid comprises an organic solvent, an inorganic solvent, or a combination thereof.

8. The apparatus of claim 1, wherein the hermetically sealable vessel is removably coupled to the hermetically sealable receiver via a hermetically sealed sliding coupling.

9. The apparatus of claim 1, wherein the hermetically sealable vessel is removably coupled to the fluid source.

10. The apparatus of claim 1, wherein the hermetically sealable vessel is removably attached to a base.

11. The apparatus of claim 10, wherein the hermetically sealable vessel is pivotally rotatable attached to the base, wherein the hermetically sealable vessel is vertically movable from the base.

12. The apparatus of claim 1, wherein the hermetically sealable vessel is removably coupled with a hermetically sealable shear mixer, wherein the hermetically sealable shear mixer is configured to receive the nano-material and fluid mixture from the hermetically sealable vessel and configured to further increase the isolation between the particles of the nano-material.

13. The apparatus of claim 1, wherein the hermetically sealable vessel is removably coupled with a hermetically sealable multi-ports switch comprising a plurality of multi-ports, thereby forming an integrated sealable apparatus, wherein the hermetically sealable multi-ports switch switchably connects any two of the plurality of multi-ports.

14. The apparatus of claim 13, wherein the hermetically sealable multi-ports switch contains three connectable ports, wherein the hermetically sealable multi-ports switch switchably connects any two of the three connectable ports, wherein a first connectable port connects to a mixer, wherein a second connectable port connects to a fluid outlet, and wherein a third connectable port connects to a channel configured to re-circulate the fluid in a sealed loop from the hermetically sealable vessel through the mixer and a cooling device back to the hermetically sealable vessel.

15. The apparatus of claim 1, wherein the nano-material source is a nano-material producing apparatus.

16. The apparatus of claim 15, wherein the nano-material producing apparatus is a plasma production apparatus.

* * * * *

UNITED STATES PATENT AND TRADEMARK OFFICE
CERTIFICATE OF CORRECTION

PATENT NO. : 8,828,328 B1
APPLICATION NO. : 12/969503
DATED : September 9, 2014
INVENTOR(S) : David Leamon et al.

It is certified that error appears in the above-identified patent and that said Letters Patent is hereby corrected as shown below:

Title Page

Item (73) for Assignee, delete "SDCmaterails, Inc., Tempe, AZ (US)" and insert

--SDCMATERIALS, INC., Tempe, AZ (US)--

Signed and Sealed this
Twelfth Day of May, 2015

Michelle K. Lee
*Director of the United States Patent and Trademark Office*